(12) United States Patent
Yoshino

(10) Patent No.: US 7,206,226 B2
(45) Date of Patent: Apr. 17, 2007

(54) NON-VOLATILE MEMORY ELEMENT HAVING MEMORY GATE AND CONTROL GATE ADJACENT TO EACH OTHER

(75) Inventor: Akira Yoshino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 179 days.

(21) Appl. No.: 11/054,389

(22) Filed: Feb. 10, 2005

(65) Prior Publication Data
US 2005/0180207 A1 Aug. 18, 2005

(30) Foreign Application Priority Data
Feb. 13, 2004 (JP) ............... 2004-036871

(51) Int. Cl.
*G11C 11/34* (2006.01)
(52) U.S. Cl. ................... 365/185.05; 365/63
(58) Field of Classification Search ......... 365/185.05, 365/63
See application file for complete search history.

(56) References Cited

U.S. PATENT DOCUMENTS 6,677,214 B1 * 1/2004 Shindo et al. ........... 438/365

2002/0141237 A1 * 10/2002 Goda et al. ........... 365/185.03

FOREIGN PATENT DOCUMENTS

JP P2001-57394 A 2/2001

OTHER PUBLICATIONS

Matsuzaki, N., et al., "A 0. 18-μm Embedded MNOS-Type Non-volatile Memory for High-Frequency and Low-Voltage Operation", Extended Abstracts of the 2003 International Conference on Solid State Devices and Materials, Tokyo, pp. 204-205 (2003).

* cited by examiner

Primary Examiner—Tuan T. Nguyen
(74) Attorney, Agent, or Firm—Foley & Lardner LLP

(57) ABSTRACT

A memory element structured so as to reduce the size and improve reliability such that a memory gate and control gate are adjacent to each other. The side of a memory gate 115 in contact with a control gate 126 is formed by etching back. This side has a circular arc-shaped curve and is convex towards the control gate 126. By doing this, a short circuit between the electrodes created by the occurrence of a thin film part in an HTO film 108 can be suppressed.

18 Claims, 31 Drawing Sheets

NON-VOLATILE MEMORY ELEMENT HAVING MEMORY GATE AND CONTROL GATE ADJACENT TO EACH OTHER

FIELD OF THE INVENTION

The present invention relates to a non-volatile memory element comprising a memory gate and control gate, and a process for manufacturing the same.

BACKGROUND OF THE INVENTION

Non-Patent Document 1 describes a conventionally known example of the structure of a non-volatile memory element. This element has a control gate formed on the side of a memory gate. Hereinafter, a process for manufacturing this element is described in order of steps with reference to drawings.

First, a structure shown in FIGS. 27A, 27B is formed. FIG. 27A is a plan and FIG. 27B is a sectional view taken along a line A–A' in FIG. 27A. In other words, after a memory gate film 202 is formed on a silicon substrate 200, polycrystalline silicon 204 and an HTO (high temperature CVD silicon oxide) film 206 are formed thereon. Then, after a mask is formed in a prescribed area on the HTO film 206 using a lithography process, the polycrystalline 204 and the HTO film 206 are subjected to patterning by dry etching, and an electrode structure shown is formed. Next, as shown in FIG. 28 (FIG. 28A is a plan and FIG. 28B is a sectional view taken along a line A–A' in FIG. 28A), the sides of the electrode structure are enclosed with an HTO film 208, and a memory gate 216 is produced. Then, after a polycrystalline silicon film is formed on the whole surface of the substrate covering the memory gate 216 and a mask is formed on the memory gate 216 using a lithography process, a control gate 212 is produced by selectively dry-etching the polycrystalline silicon as shown in FIG. 29. FIG. 29A is a plan and FIG. 29B is a sectional view taken along a line A–A' in FIGS. 29A, 27B. Further, impurity diffusion regions 214 are formed by ion implanting. An interlayer-insulating film 217 is formed, so are contact plugs 218 on top of the impurity diffusion regions 214, the memory gate 216, and the control gate 212, and a structure shown in FIG. 30 is achieved. FIG. 30A is a plan and FIG. 30B is a sectional view taken along a line A–A' in FIG. 30A.

Patent Document 1 describes a different process for manufacturing memory element from the one described above. In the process described in this document, after a control gate is formed, a memory gate is formed on the side of the control gate by etching back, enabling a memory element to be produced in one lithography process.

[Non-Patent Document 1]
Extended Abstracts of the International Conferences on Solid State Devices and Materials, Tokyo, 2003, pp204–205.

[Patent Document 2]
Japanese Patent Kokai Publication No. P2001-57394A

SUMMARY OF THE DISCLOSURE

However, the conventional technology described above still has room for improvement in terms of the following points:

In the technology described in Non-Patent Document 1, since separate lithography processes are performed at the stages of forming the memory gate and control gate, misalignment between the memory gate and control gate can easily occur. Such misalignment can result in fluctuation in the write/read characteristics of the memory element, depending on the size of the misalignment. In order to minimize the fluctuation of the characteristics, the memory element has to be bigger than a certain size. This has limited the effort in reducing the size of the element.

On the other hand, in Patent Document 2, the problem with the process described in Non-Patent Document 1 is solved by forming the memory gate by etching back and producing the memory element in one lithography process. However, in the technology described in Patent Document 2, the lateral side wall of the control gate is formed using a lithography process and dry etching process, and is perpendicular to the substrate surface. An insulating film is provided on the surface of the lateral side wall, creating a structure in which the memory gate is adjacent to the control gate with the interposed insulating film. Therefore, in order to secure insulation between the memory gate and control gate, the insulating film between them needs to have a certain amount of thickness. However, if the insulating film becomes too thick, the data writing speed might decrease. Therefore, there is still room for improvement in terms of the balance between insulation stability and high speed operability.

The present invention aims at solving the problems described above, and it is an object thereof to preserve the high speed operability of a memory element that exerts potential control over the memory gate and control gate independently while securing the insulation between the memory gate and control gate, and to provide a technology where the size reduction of the element is possible.

According to a first aspect of the present invention, there is provided a non-volatile memory element comprising a semiconductor substrate, a first impurity diffusion region and a second impurity diffusion region provided on the semiconductor substrate, a memory gate with a charge accumulation section provided on a part of a channel region disposed between the first and second impurity diffusion regions, and a control gate provided on another part of the channel region adjacent to the memory gate interposed with an insulating film. The electric potentials of the memory gate and control gate are controlled independently. The side of the memory gate in contact with the control gate has a curved surface and is convex towards the control gate, and the control gate is provided on this curved surface interposed with the insulating film.

As described in the conventional technology, in the case where a memory gate is provided so that it is in contact with a control gate with a rectangular cross sectional view, a thin film part is likely to occur in the insulating film at the angular (corner) part of the control gate and electrical leakage might occur between the two electrodes. Such a problem can be solved by the present invention. In other words, according to the present invention, since the control gate is provided on the curved surface of the side of the memory gate, they are in contact with each other without any angular part in between, and the electrical leakage between the two electrodes can be suppressed effectively. Furthermore, since the entire thickness of the insulating film can be minimized, it is possible to set a sharp potential change between the memory gate and control gate and to improve the high speed operability of the element.

In the present invention, the cross sectional shape of the control gate along the gate's longitudinal direction can become narrower towards the top and away from the semiconductor substrate. Further, a side of the control gate opposite to the one adjacent to the memory gate can have a curved surface and be convex towards the outside. By adopting such a constitution, an element structure superior in manufacturing stability can be achieved.

In the present invention, the control gate can be formed by etching back. By doing this, a fine element structure superior in manufacturing stability can be achieved.

Furthermore, in the present invention, the memory gate is formed by etching back and the control gate is provided laterally on the side (wall) formed by etching back. By doing this, a fine element structure superior in manufacturing stability can be achieved.

In the present invention, the height of the control gate can be shorter than that of the memory gate.

In the present invention, the memory gate can have a charge accumulation section, a first conductive film containing a first conductivity type impurity provided on the charge accumulation section, and a second conductive film of a first conductivity type provided on the first conductive film. The impurity concentration of the first conductive film can be different from that of the second conductive film. For example, the second conductive film can contain a higher concentration of the first conductivity type impurity than the first conductive film. For reducing electrode resistance, the memory gate should contain a higher concentration of the first conductivity type impurity. However, when high concentration impurities are introduced to the whole memory gate, the reliability of the charge accumulation section provided within the memory gate sometimes suffers. According to the constitution described above, since the charge accumulation section area of the memory gate has a relatively lower impurity concentration and the other areas have a relatively higher concentration, the decrease in the reliability of the charge accumulation section can be suppressed while reducing the electrode resistance.

In the present invention, the electrode width of the memory gate can be not less than 20 nm and not more than 200 nm. By adopting such a constitution, the whole element can be scaled down remarkably. A memory gate with such an electrode width (the length in the gate's longitudinal direction) has been difficult to produce by the conventional process. By employing the etch back technique described later and selecting etching conditions properly, the memory gate described above can be produced.

In the present invention, the charge accumulation section can adopt various constitutions. For example, the charge accumulation section can be constituted such that it comprises a silicon nitride layer, and insulating layers are provided above and below the silicon nitride layer sandwiching it. For example, it can also be a so-called ONO film in which a silicon oxide film, silicon nitride film, and silicon oxide film are laminated in order.

Furthermore, the charge accumulation section can be constituted such that it comprises a layer of multiple dot-shaped dielectric materials provided so that they are separated from each other, and insulating layers are provided above and below the dot-shaped dielectric materials sandwiching them. In this case, even when a part of the insulating film is damaged, the discharge of the electric charge is suppressed to a minimum and the long-term reliability of the charge accumulation section is improved since the dielectric films where electric charge is accumulated are provided like dots.

Furthermore, according to a second aspect of the present invention, there is provided a semiconductor device comprising a pair of non-volatile memory elements arrayed, e.g., in parallel, having the constitution described above, and the second impurity diffusion region shaped by the non-volatile memory elements share is located in a region sandwiched by these non-volatile memory elements, and wherein a conductive material is embedded an area of the second impurity diffusion region sandwiched by the pair of the non-volatile memory elements. By adopting such a constitution, in addition to the effects described above, the memory element can be scaled down while diffusion layer resistance is reduced.

Also, according to a third aspect of the present invention, there is provided a process for manufacturing a non-volatile memory element. The process comprises a step of forming a film comprising a charge accumulation section on a semiconductor substrate, and a step of forming a sacrificial filming a prescribed region on the film comprising the charge accumulation section, a step of forming a first conductive film that covers the sacrificial film, and a step of forming a first and second memory gates provided apart from each other by etching back the first conductive film and leaving the first conductive film on the side of the sacrificial film. The process further comprises: a step of forming an insulating film that covers the sides of the first and second memory gates opposite to the one on which the sacrificial film is provided, a step of forming a second conductive film over the whole surface of the substrate, and a step of forming control gates adjacent to the memory gates with the insulating film in between them by etching back the second conductive film, for leaving the second conductive film on the sides of the first and second memory gates located towards the outside as viewed from the sacrificial film.

Also, according to a fourth aspect of the present invention, there is provided a process for manufacturing a non-volatile memory element. The process comprises a step of forming a film comprising a charge accumulation section on a semiconductor substrate, a step of forming a sacrificial film with an opening is formed on the film comprising the charge accumulation section, and a step of forming a first conductive film that covers the sacrificial film. The process further comprises a step of forming first and second memory gates provided apart from each other by etching back the first conductive film for leaving the first conductive film on the side of the opening of the sacrificial film along the gate's longitudinal direction, a step of forming an insulating film that covers the sides of the first and second memory gates opposite to the one on which the sacrificial film is provided, and a step of forming an impurity diffusion region by injecting impurities into the area between the first and second memory gates on the substrate surface, a step of forming a conductive film over the impurity diffusion region, and a step of forming an insulating film that covers the sides of the first and second memory gates opposite to the one on which the conductive film is provided after the sacrificial film is removed. The process further comprises a step of forming a second conductive film on the whole surface of the substrate, and a step of forming control gates adjacent to the memory gates interposed with the insulating film in between them by etching back the second conductive film for leaving the second conductive film on the sides of the first and second memory gates located towards the outside as viewed from the conductive film. Note that, in the step of forming the insulating film that covers the first and second memory gates and in the step of forming the impurity diffusion region by injecting impurities into the area between the first and second memory gates, the order of forming the insulating film and injecting the impurities can be optional.

According to these processes, since the control gate is formed by etching back, the problem such as the misalignment described in the paragraphs of the conventional technology does not occur and a desired structure can be formed controllably. Also, the channel length of the memory element can be remarkably short. For example, an element with a channel length of not shorter than 20 nm and not longer than 200 nm can be realized.

The meritorious effects of the present invention are summarized as follows.

According to the present invention, in a memory element structured such that memory gates and control gates are adjacent to each other, the element size can be reduced and the reliability of it can be improved.

PREFERRED EMBODIMENTS OF THE INVENTION

Figure 1A:
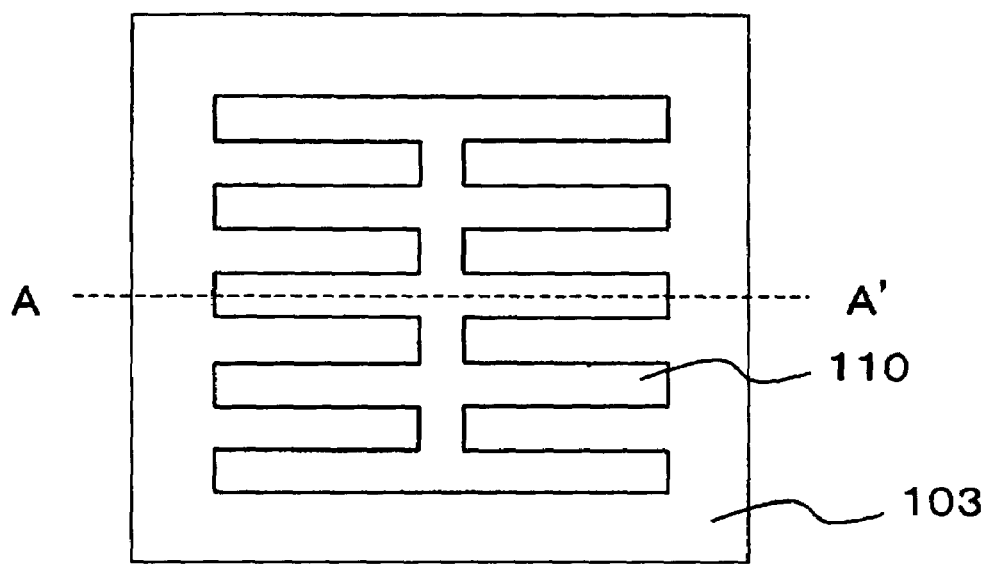
FIGS. 1A and 1B are drawings explaining a process for manufacturing a non-volatile memory element of an embodiment.

The present invention relates to a memory element structured such that a memory gate and control gate are provided adjacent to each other on a channel region. First, the operation of a memory element with such a structure is described in order of steps with reference to FIG. 11. Memory gate and control gate are abbreviated as MG and CG respectively in the drawings.

Figure 11A:
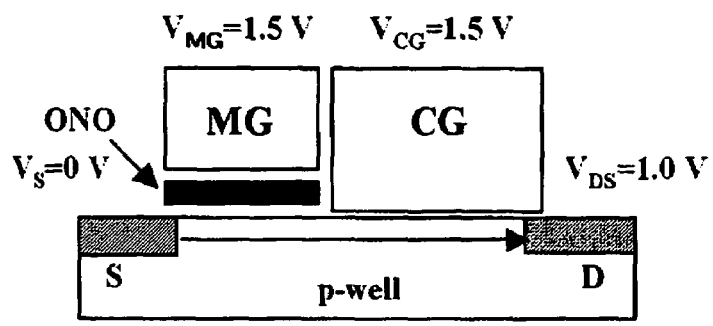
FIGS. 11A to 11D are conceptual drawings explaining the operation of a non-volatile memory element of an embodiment.

(i) Erased State (Refer to FIG. 11A.)

This is a state where no electron is captured in a SiNx film within an ONO film. When Vread=VMG=1.5V is applied, a channel region is inverted from P-type to N-type and a drain current starts to flow. CG and MG are controlled separately during write/erase operation. By providing the MG on a source side, an electric potential close to a source junction can be controlled more efficiently.

Figure 11B:
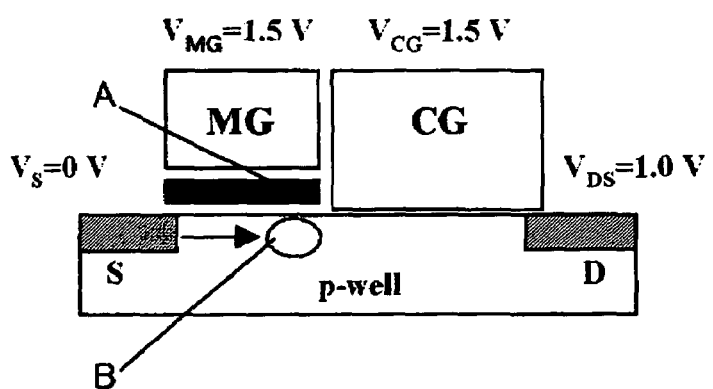

(ii) Write State (Refer to FIG. 11B.)

This is a state where electrons are captured in the SiNx film within the ONO film. In the region (indicated as B in the drawing) directly beneath the region where the electrons are captured (indicated as A in the drawing), the surface potential (potential of the Si/SiO2 interface) is lowered by the captured electrons mentioned above, and the channel part of this region is not inverted from P-type to N-type even when Vread is applied. Therefore, a drain current does not flow when Vread is applied.

Figure 11C:
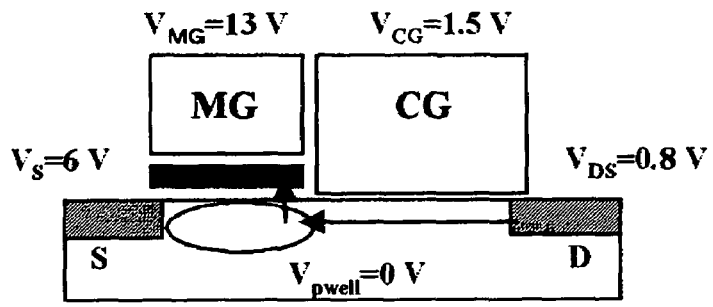

(iii) Write Operation (Refer to FIG. 11C.)

A write operation is performed by injecting electrons into the SiNx film within the ONO film. A VCG and VMG are controlled independently so that the channel region below the CG and the channel region below the MG are in strong inversion. The SiO2 film below the CG can be thinner than the one below the MG. Since the CHE are injected into the SiNx film provided on a drain side, the size relationship between a VDS and VS is opposite of the ones in ordinary NMOS and FG-type cell.

Since there is a sudden increase of the electric potential of the p-well at the boundary between the CG and MG, the electrons that flow from the channel below the CG are accelerated rapidly sensing this rapid potential change (electric field intensity variation), excited to a high energy state, and injected efficiently into the SiNx film sensing an electric field in the vertical direction from the MG.

Figure 11D:
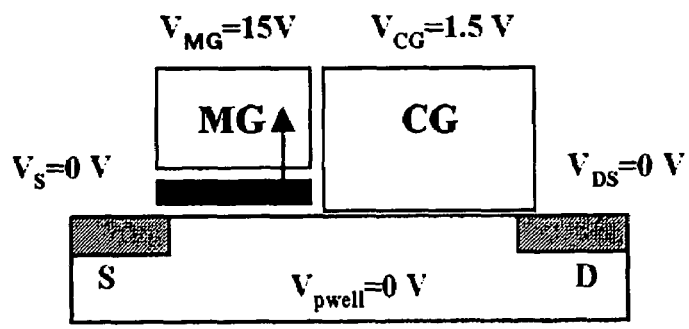

(iv) Erase Operation (Refer to FIG. 11D.)

An erase operation is performed by extracting the captured electrons within the SiNx film. The captured electrons within the SiNx film are extracted into the MG, not into the p-well. By this means, it becomes possible to suppress the deterioration of the oxide film which is disposed beneath the SiNx. Next, embodiments of the present invention will be described with reference to drawings. Note that similar signs are assigned to similar structural elements and no explanation is provided when unnecessary.

[Embodiment 1]

Figure 12:
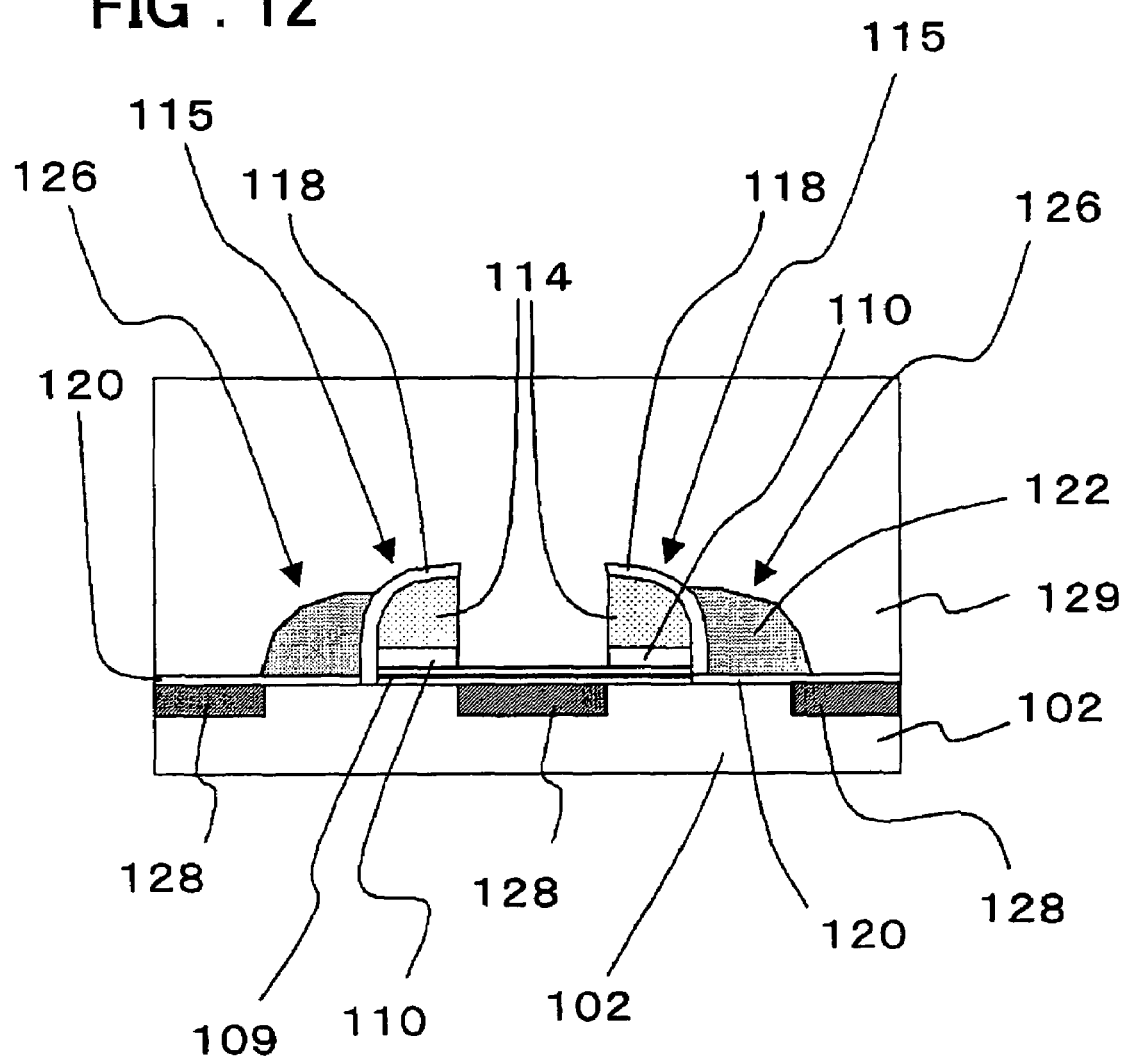
FIG. 12 is a sectional view of a non-volatile memory element of an embodiment.

FIG. 12 is a cross sectional view of a memory element that relates to a first embodiment. Impurity diffusion regions 128 are formed being separated from each other on the surface of a silicon substrate 102. In the regions in between the impurity diffusion regions 128, a memory gate 115 and a control gate 126, provided adjacently to the former, are formed.

The memory gate is structured such that a floating gate 109, polycrystalline silicon 110, and polycrystalline silicon 114 are laminated in order. The polycrystalline silicon 110 and polycrystalline silicon 114 are both made up of polycrystalline silicon with n-type impurities, however, the polycrystalline silicon 114 can have a higher impurity concentration than the polycrystalline silicon 110 does.

The side of the memory gate 115 in contact with the control gate 126 is formed by etching back. This side has an arc-shaped curve and is convex towards the control gate 126. As shown in the drawing, the cross sectional view of the memory gate 115 along the gate's longitudinal direction is nearly fan-shaped, becoming narrower towards the top and away from the silicon substrate 102.

The control gate 126 is structured such that a gate insulating film 120 and polycrystalline silicon 122 are laminated in order. An HTO film 118 is interposed between the memory gate 115 and control gate 126, and insulates between the two.

The side of the control gate 126 opposite to the one in contact with the memory gate 115 is formed by etching back. This side has a circular or arc-shaped curve and is convex towards the outside and away from the control gate 126. As shown in the drawing, the sectional view of the control gate 126 along the gate's longitudinal direction is nearly fan-shaped, becoming narrower towards the top and away from the silicon substrate 102.

The operation of the memory element shown in FIG. 12 is as described with reference to FIG. 11.

Next, a process for manufacturing the memory element shown in FIG. 12 is described with reference to drawings. In the drawings below, sub-figure B is a sectional view taken along a line A–A' in sub-figure A.

Figure 1B:
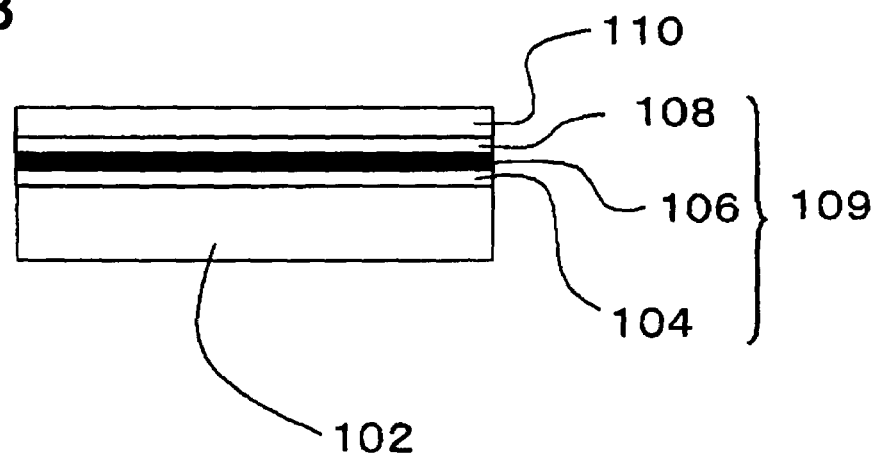
Figure 2A:
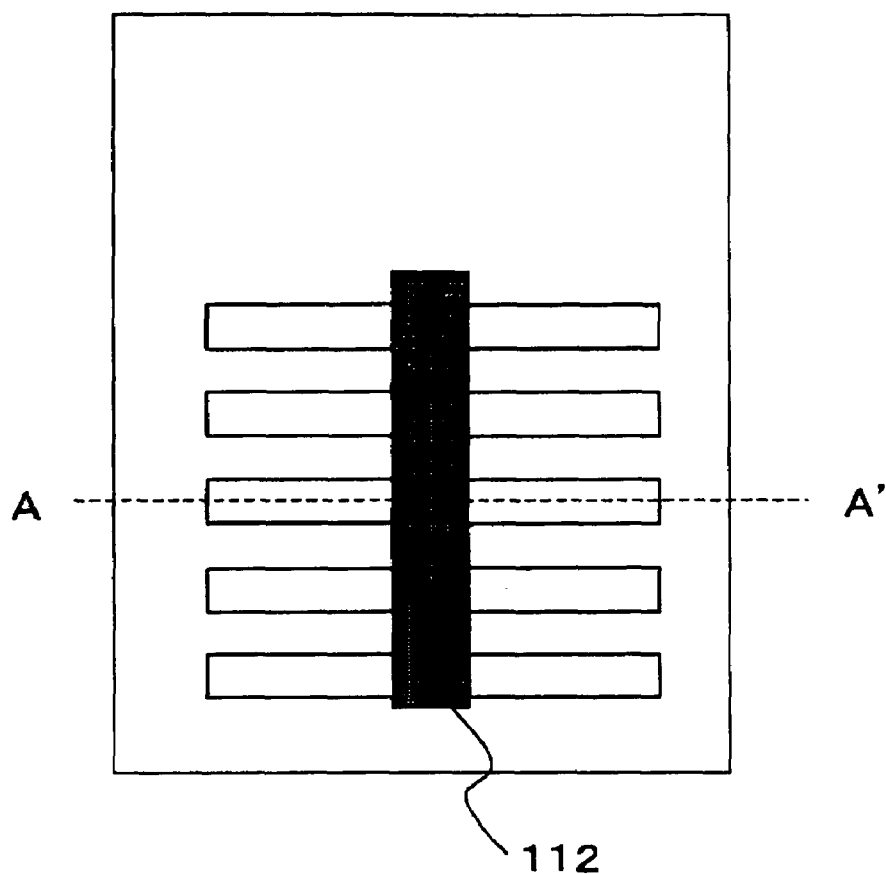
FIGS. 2A and 2B are drawings explaining a process for manufacturing a non-volatile memory element of an embodiment.
Figure 2B:
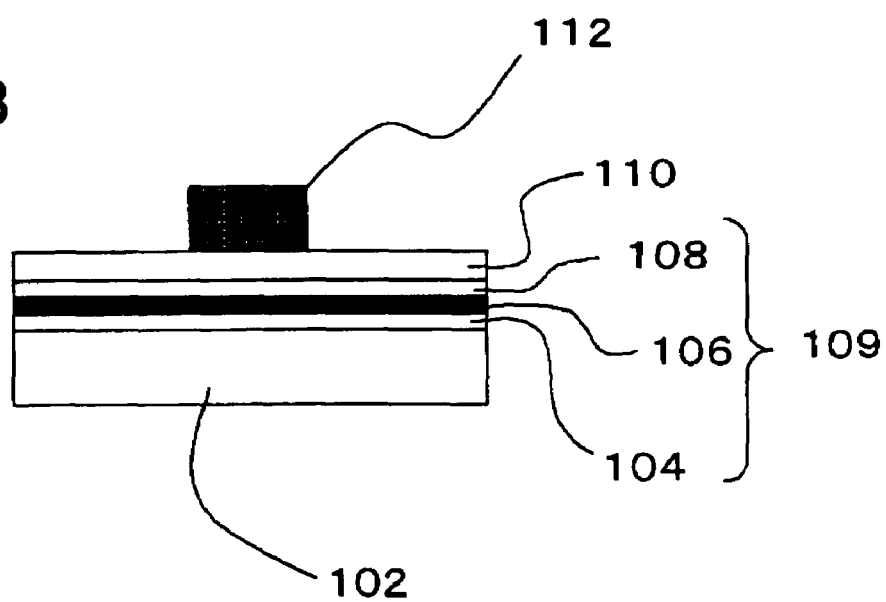

First, a floating gate 109 comprising a silicon oxide film 104, a silicon nitride film 106, and a silicon oxide film 108, and a polycrystalline silicon (film) 110 are formed on a silicon substrate 102. Then, by forming an element isolation region 103, a structure shown in FIG. 1 is obtained. Further, a silicon nitride film is formed over the whole surface of the substrate. This nitride film is subjected to patterning by reactive ion etching, and a silicon nitride film 112 is formed in a stripe form as shown in FIG. 2.

Figure 3A:
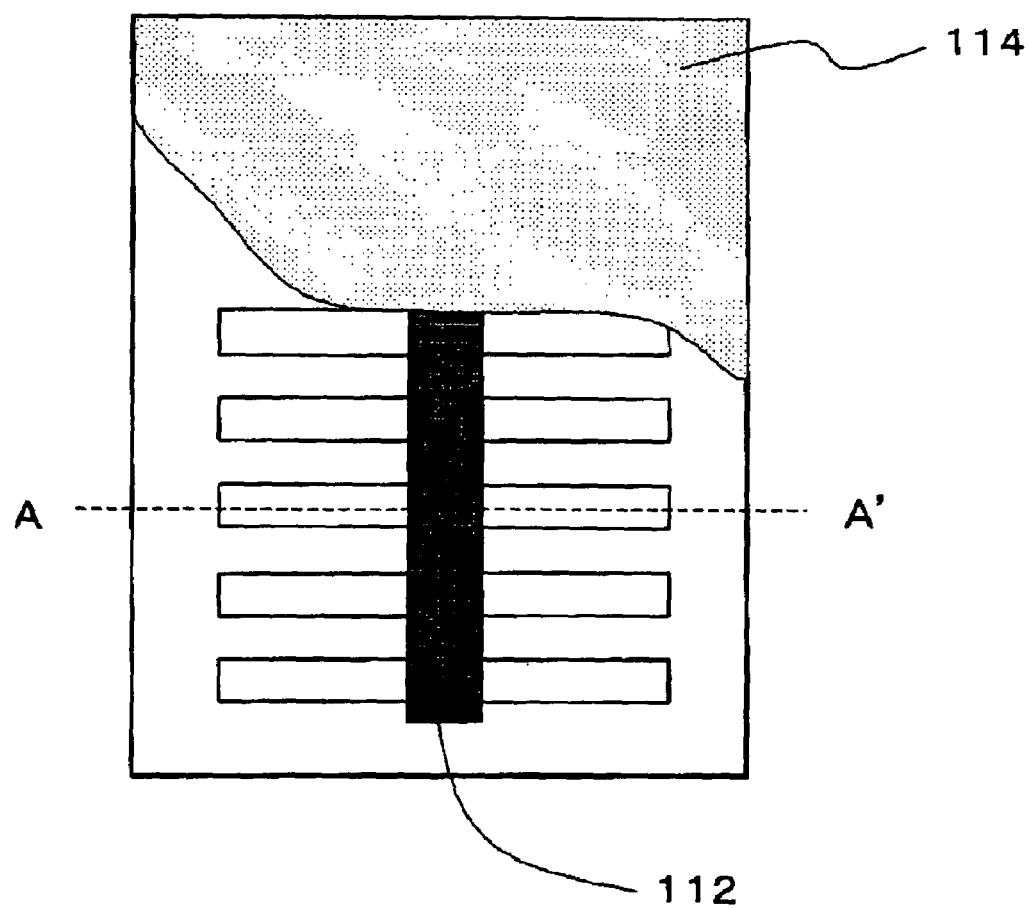
FIGS. 3A and 3B are drawings explaining a process for manufacturing a non-volatile memory element of an embodiment.
Figure 3B:
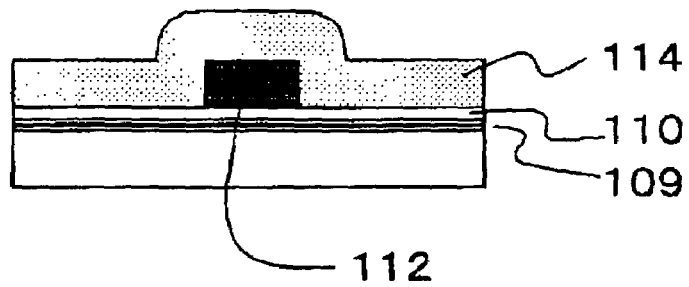

Then, a polycrystalline silicon film 114 is formed over the whole surface of the substrate as shown in FIG. 3. The film thickness of the polycrystalline silicon film 114 prescribes the channel length of the memory gate. The polycrystalline silicon film 114 can be as thin as approximately 30 nm for example. By making the film thickness of the polycrystalline silicon film 114 so thin, it becomes possible to make the channel length of the memory gate short and reduce the channel resistance of the memory gate drastically. The readout current can be increased and, as a result, it becomes possible to improve the operation speed. In the present embodiment, the thickness of the polycrystalline silicon film 114 is set at 150 nm.

Figure 4A:
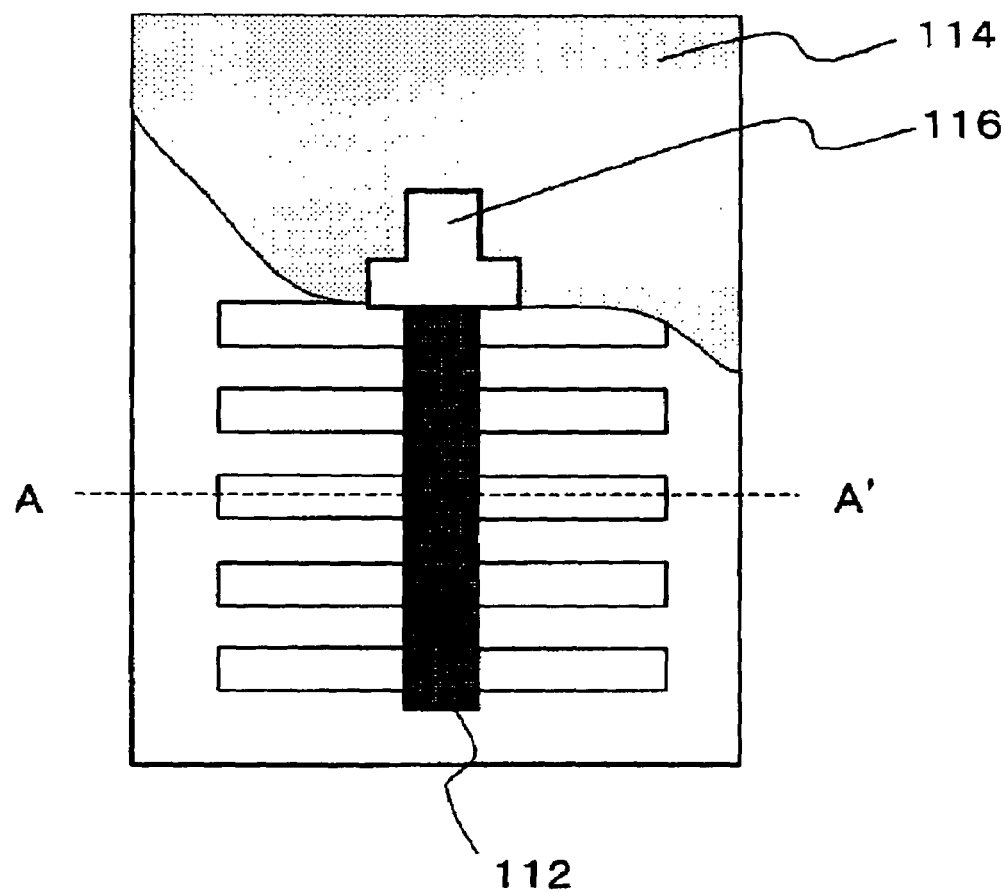
FIGS. 4A and 4B are drawings explaining a process for manufacturing a non-volatile memory element of an embodiment.
Figure 4B:
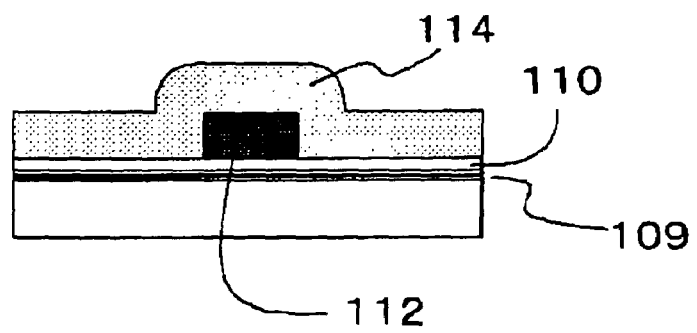
Figure 5A:
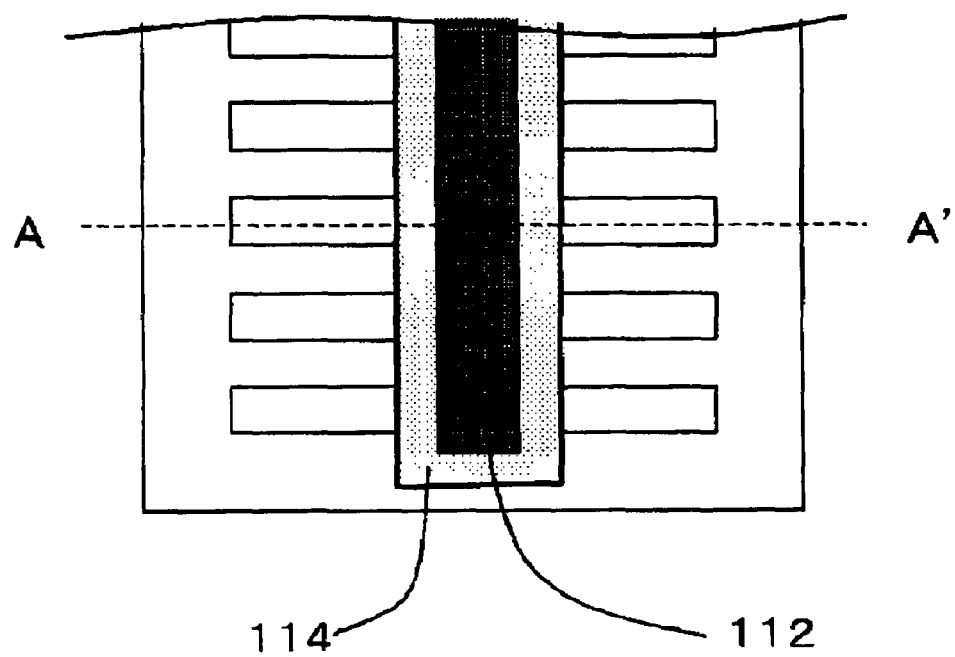
FIGS. 5A and 5B are drawings explaining a process for manufacturing a non-volatile memory element of an embodiment.
Figure 5B:
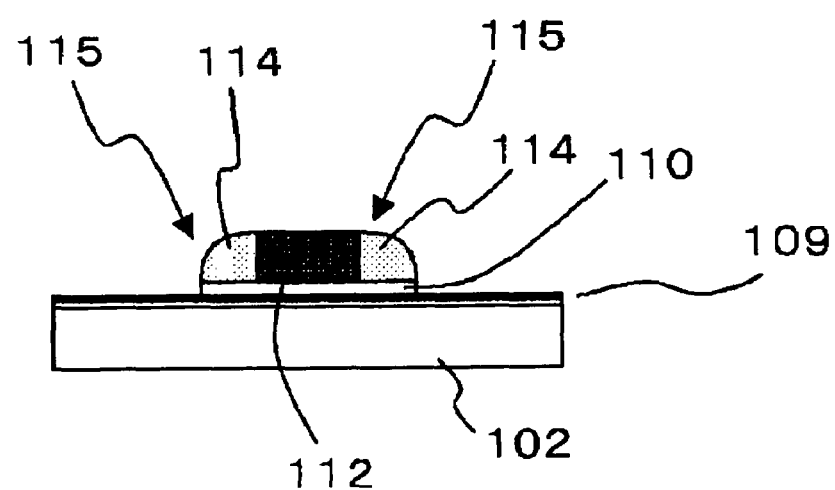

Next, after a photoresist pattern film 116 is formed on the polycrystalline silicon film 114 as shown in FIG. 4, the polycrystalline silicon film 114 is etched back. At the same time, the polycrystalline silicon (film) 110 is etched back together with the polycrystalline silicon film 114. By this etch back process, a structure shown in FIG. 5 is achieved. In other words, the polycrystalline silicon (film) 110 is formed on a prescribed area of the floating gate 109, and the silicon nitride film 112 is formed in a region on top thereof. Also, the polycrystalline silicon film 114 is formed on both sides of the silicon nitride film 112. FIG. 5B is a cross sectional view perpendicular to the extended direction of the silicon nitride film 112, and as shown in the drawing, the side of the polycrystalline silicon film 114 opposite to the one in contact with the silicon nitride film 112 has a smoothly curved surface.

Next, after the floating gate 109 is removed by etching back, an HTO film is formed over the whole surface. In the present embodiment, the film thickness is set at 5 to 10 nm. The film-forming temperature is set at approximately 800 degrees centigrade for example. The HTO film is formed securely on the side of the polycrystalline silicon film 114, therefore the occurrence of thin film portions, a problem in the conventional technology, can be suppressed efficiently. This HTO film insulates between the memory gate 115 and the control gate, which will be formed later.

Figure 6A:
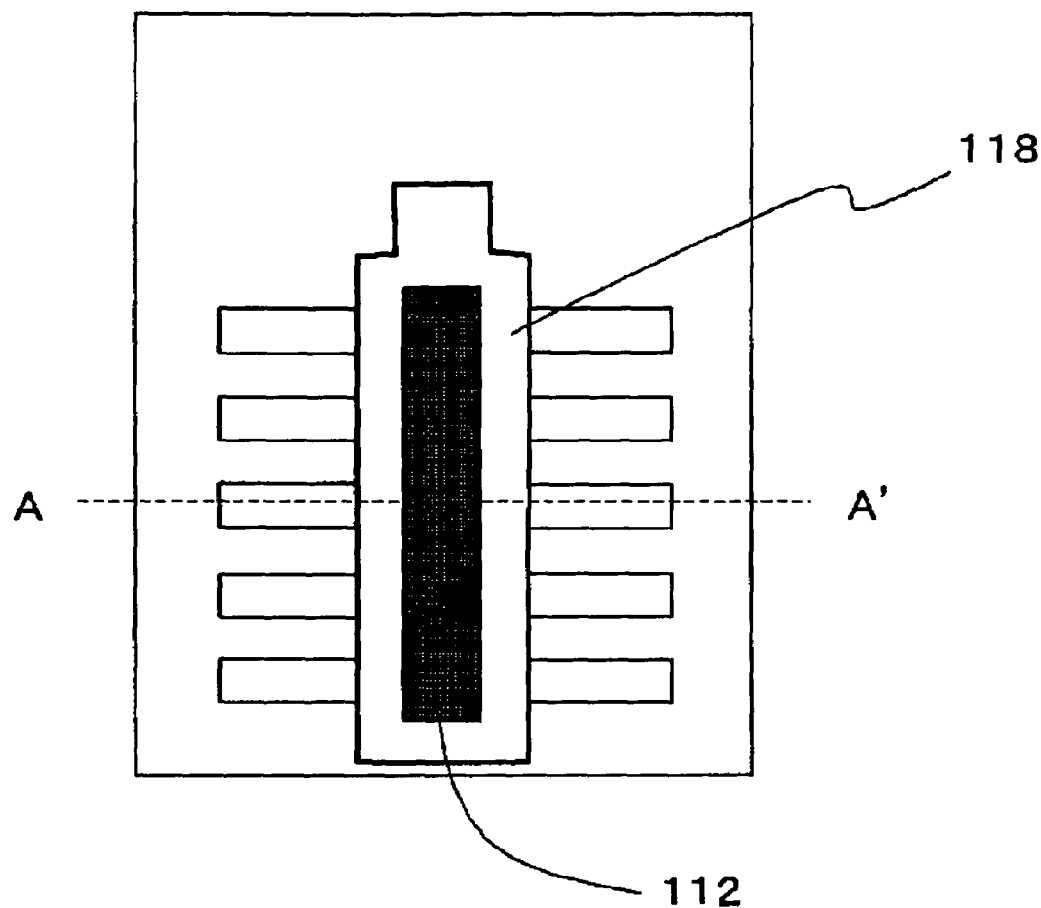
FIGS. 6A and 6B are drawings explaining a process for manufacturing a non-volatile memory element of an embodiment.
Figure 6B:
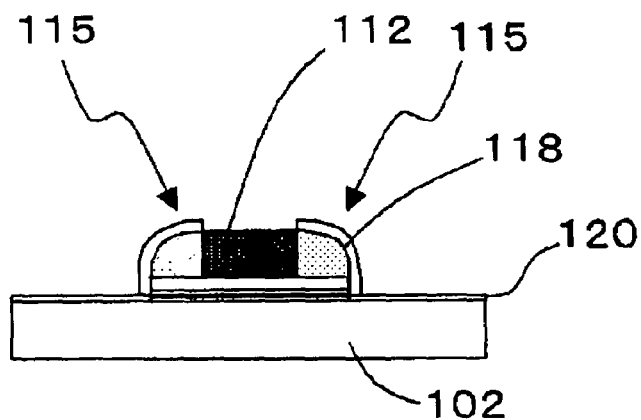

Then, the HTO film is etched back, and the HTO film 118 is left on the side (curved surface) of the polycrystalline silicon film 114 extending up to the top thereof. The surface of the silicon substrate 102 is thermally oxidized, forming a gate insulating film 120, and a structure shown in FIG. 6 is achieved.

Figure 7A:
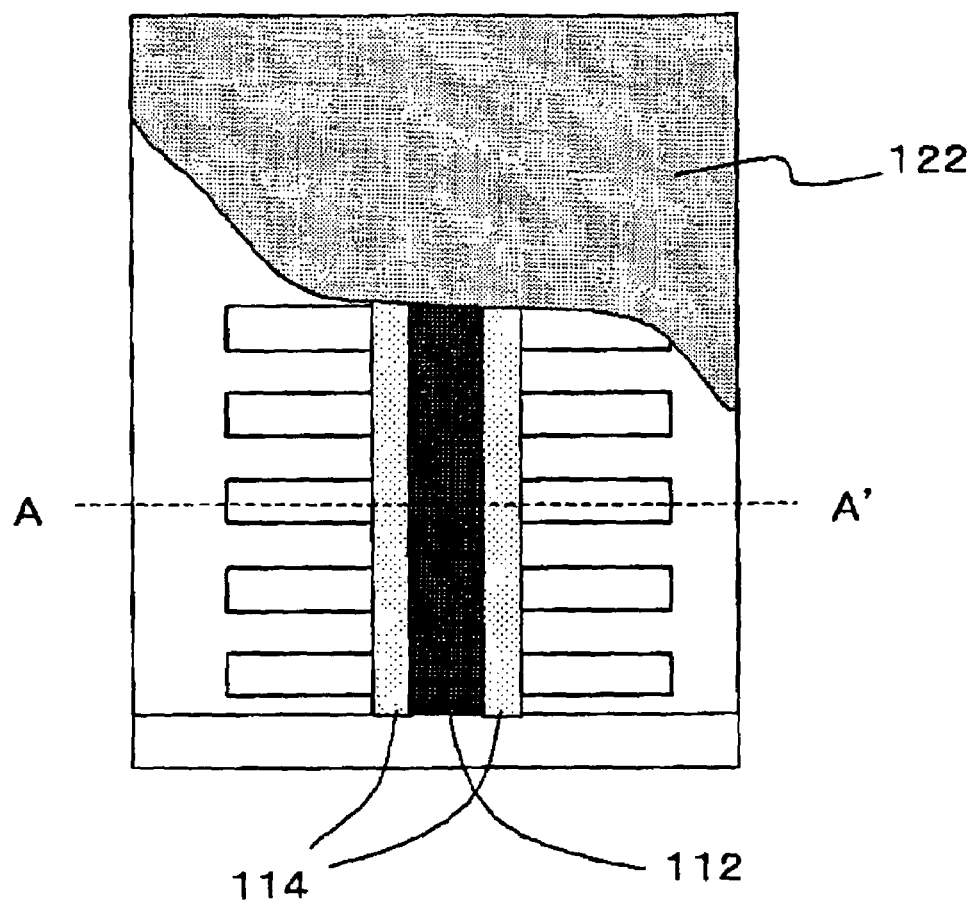
FIGS. 7A and 7B are drawings explaining a process for manufacturing a non-volatile memory element of an embodiment.
Figure 7B:
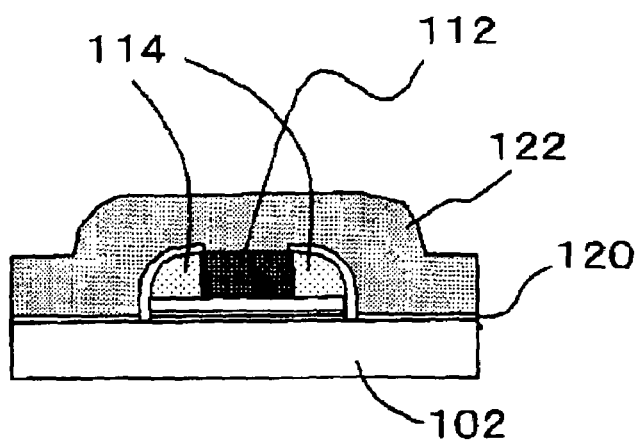

Next, as shown in FIG. 7, a polycrystalline silicon film 122 is formed over the whole surface of the substrate.

Figure 8A:
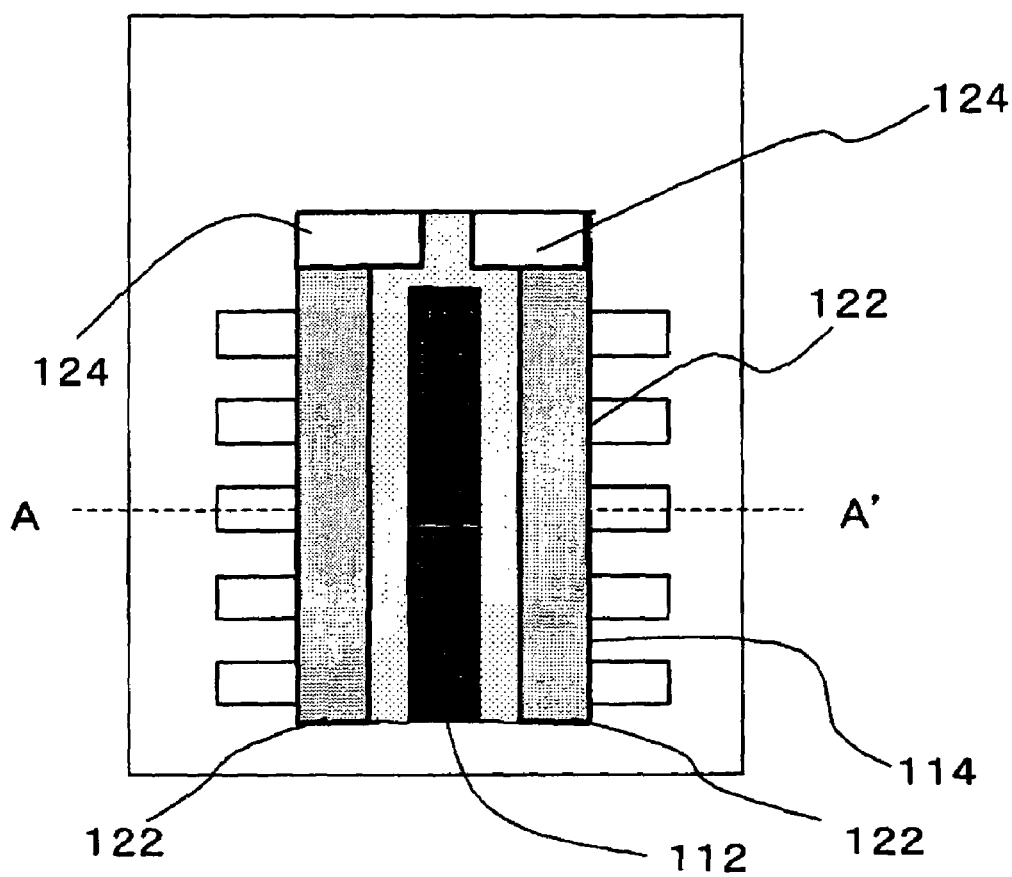
FIGS. 8A and 8B are drawings explaining a process for manufacturing a non-volatile memory element of an embodiment.
Figure 8B:
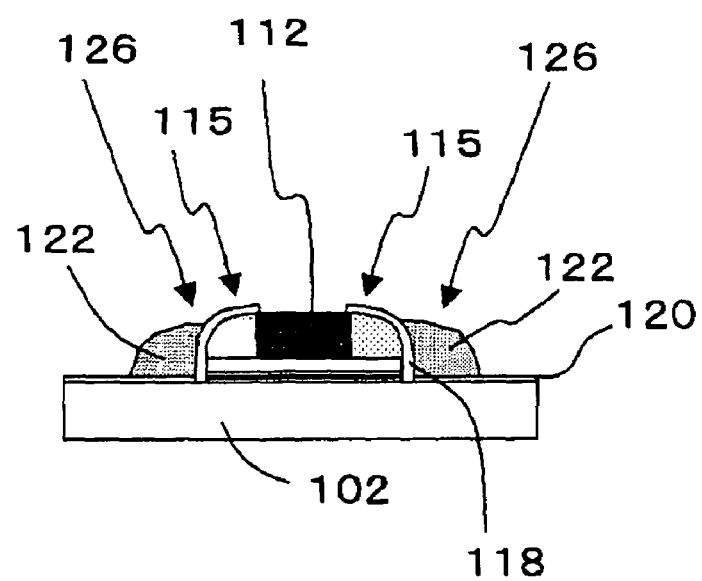

After photoresists patterns 124 are formed in the region where pads of the control gate will be formed, the polycrystalline silicon film 122 is etched back, forming a control gate 126. FIG. 8 shows the result after the etch back process. The control gate 126 is provided on the sides of the memory gate 115. The control gate 126 is formed so that its height is shorter than that of the memory gate 115.

Figure 9A:
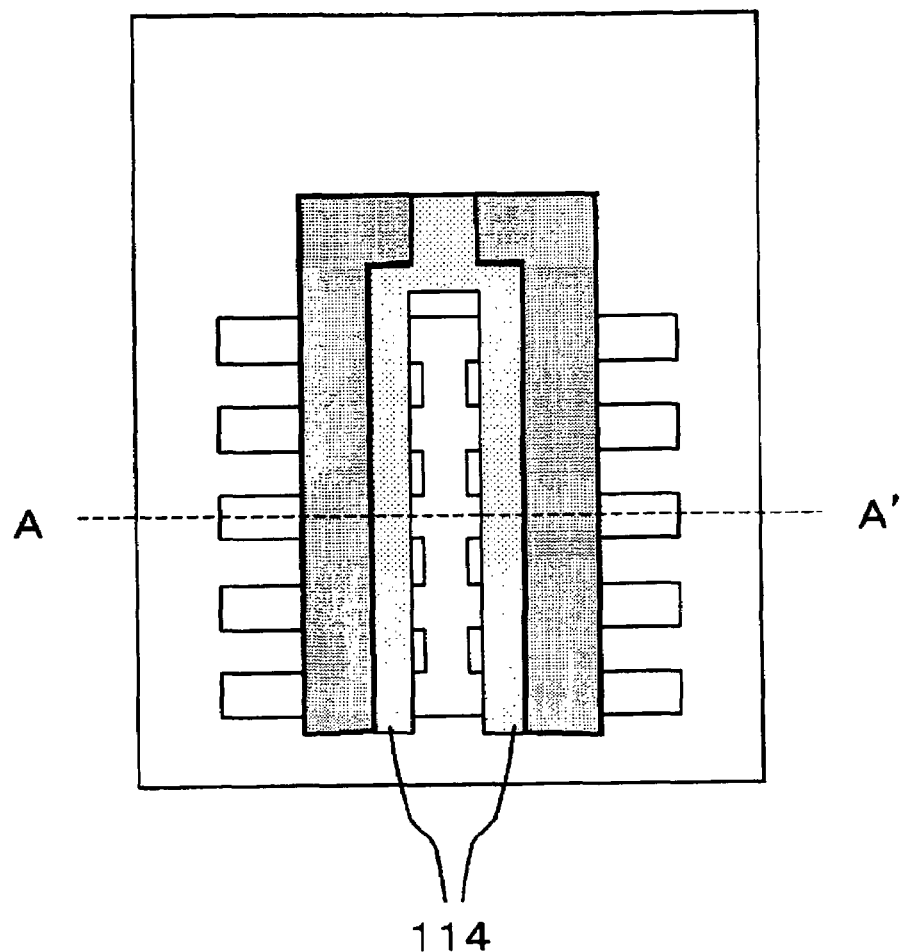
FIGS. 9A and 9B are drawings explaining a process for manufacturing a non-volatile memory element of an embodiment.
Figure 9B:
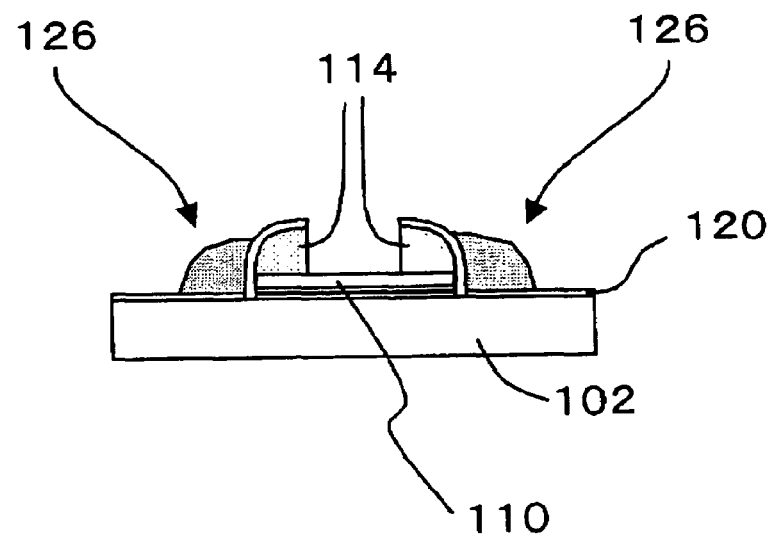

Then, the silicon nitride film 112 surrounded by the memory gate 115 is removed by wet etching as shown in FIG. 9. Heated phosphoric acid can be used as an etching liquid for example. Since it has a high selectivity between polysilicon and nitride silicon, the etching process stops at the polycrystalline silicon 110 and the polycrystalline silicon 114.

Figure 10A:
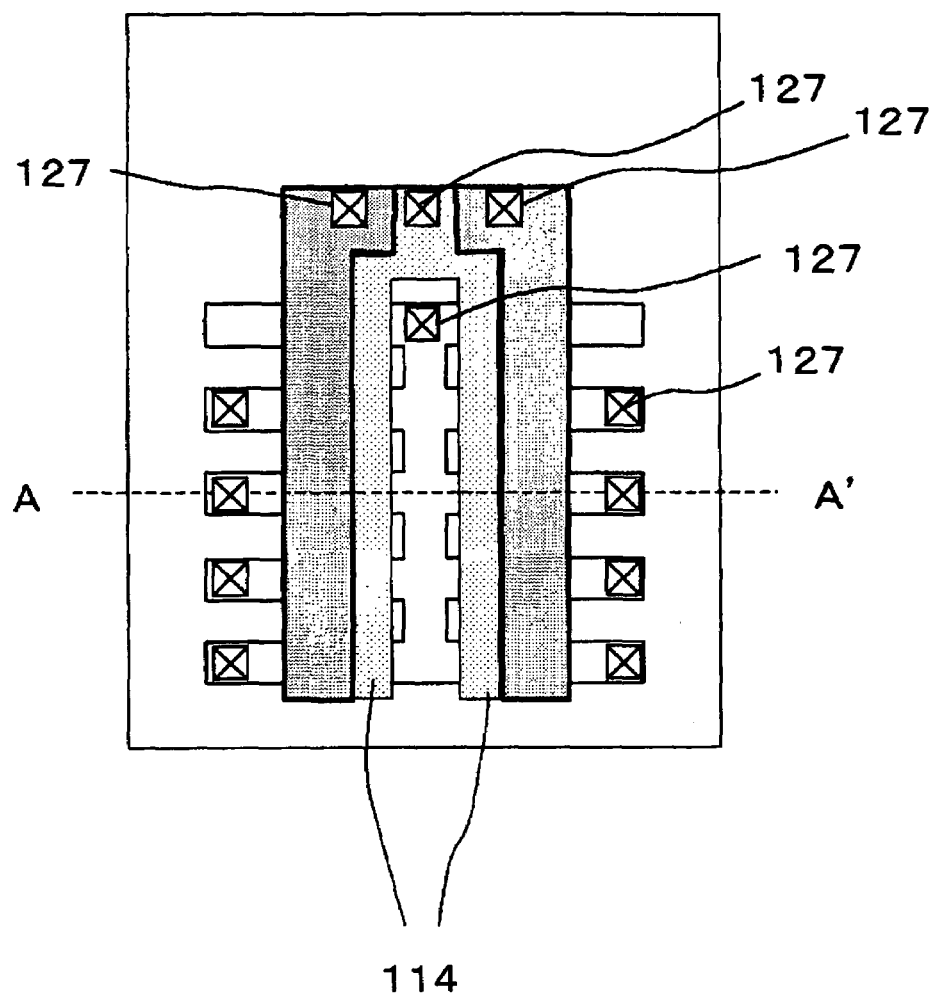
FIGS. 10A and 10B are drawings explaining a process for manufacturing a non-volatile memory element of an embodiment.
Figure 10B:
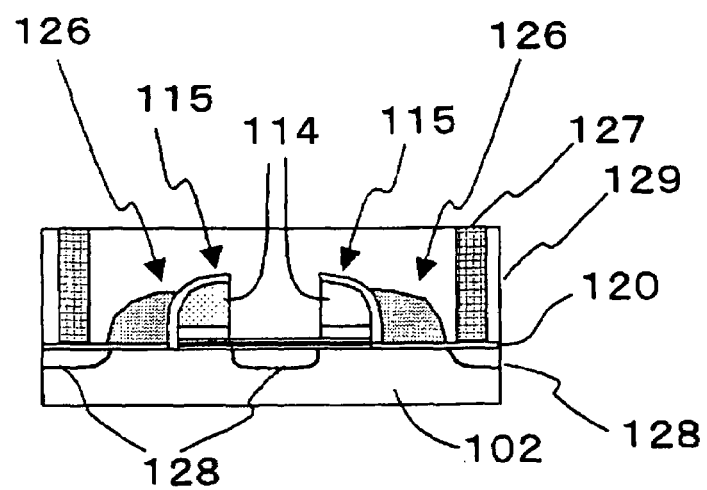

After the silicon nitride film 112 is etched, an exposed portion of the polycrystalline silicon film 110 is removed by dry etching. Then, source drain regions 128 are formed on both sides of the memory gate 115 and control gate 126 by ion implanting. Further, an interlayer-insulating film 129 is formed over the memory gate 115 and control gate 126. After that, contact plugs 127, to which the memory gate 115 and control gate 126 are connected separately, are created within the interlayer-insulating film 129 (FIG. 10A). By the contact plugs 127, the electric potential of the memory gate 115 and control gate 126 are controlled independently, thus high speed stable operation of the memory element becomes possible.

The memory element shown in FIG. 12 can be achieved as described above. The action effects of the memory element shown in FIG. 12 are as follows:

Since the control gate 126 is formed by etching back, the problem such as the misalignment described in the conventional technology paragraphs does not occur and a desired structure can be formed controllably. Also, the channel length of the control gate 126 can be remarkably short. In the conventional technology, since separate lithography processes are performed at the stages of forming the memory gate 115 and control gate 126, a misalignment between them can easily occur. Such a misalignment can be even more significant when the gate lengths of the memory gate 115 and control gate 126 are made shorter. When such a misalignment occurs, it will result in fluctuation in the write/read characteristics of the memory element, depending on the size of the misalignment. In order to minimize the fluctuation of the characteristics, the memory element has to be bigger than a certain size. This has limited the effort in reducing the size of the element.

In the present embodiment, since the control gate 126 is formed by etching back (of a uniformly deposited film), such a problem can be solved and it becomes possible to produce a fine element controllably. For example, even in the case where the channel length of the control gate 126 and the gate length of the memory gate 115 are set at not more than 100 nm or even 50 nm or less, the control gate 126 can be formed with an excellent position controllability.

Further, since the height of the control gate 126 is shorter than that of the memory gate 115 in the present embodiment, the insulation between the control gate 126 and memory gate 115 is secured well. Since the insulating film is formed stably on the side (wall) surface of the memory gate 115, by making the height of the control gate 126 shorter, the insulation between the two will be stable.

Also, in the present embodiment, the side of the memory gate 115 has a curved surface, and the HTO film 118, which secures the insulation between the memory gate 115 and the control gate 126, is provided on this curved surface. Therefore, thin film portions are not likely to occur unlike the cases with the conventional technology, and the insulation between the memory gate 115 and control gate 126 can be stably realized.

Furthermore, since the side of the control gate 126 is structured such that it has a curved surface as that of the memory gate 115, the embedding property between the memory gate 115 and control gate 126 by the insulating film becomes superior, and the flatness of their upper layers will be improved.

Also, in the present embodiment, the high speed operability of the memory element can be maintained while the insulation between the memory gate and control gate is ensured. Hereinafter, this point will be explained in detail:

The kind of memory element described in the present embodiment is structured such that hot electrons, generated by sharply changing the substrate surface potential between the memory gate and control gate, are efficiently injected into a charge accumulation section. Because of this, the data write time can be shortened greatly. In order to change the surface potential sharply, it is necessary to make the insulating film between the memory gate and control gate thin. However, if the above-mentioned insulating film is too thin, a current leakage portion between the memory gate and control gate is likely to occur.

Figure 31A:
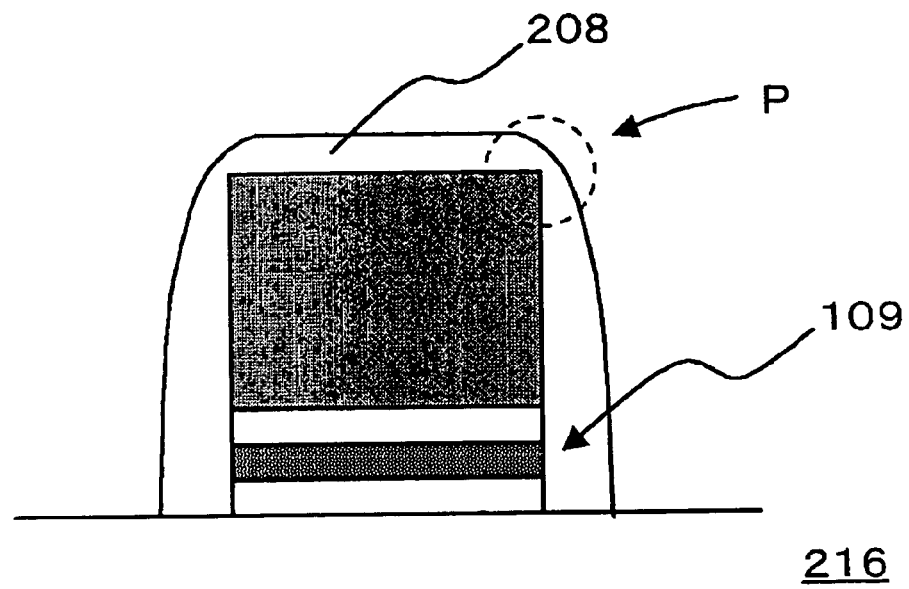
FIGS. 31A and 31B are drawings explaining problems in the conventional element structure.
Figure 31B:
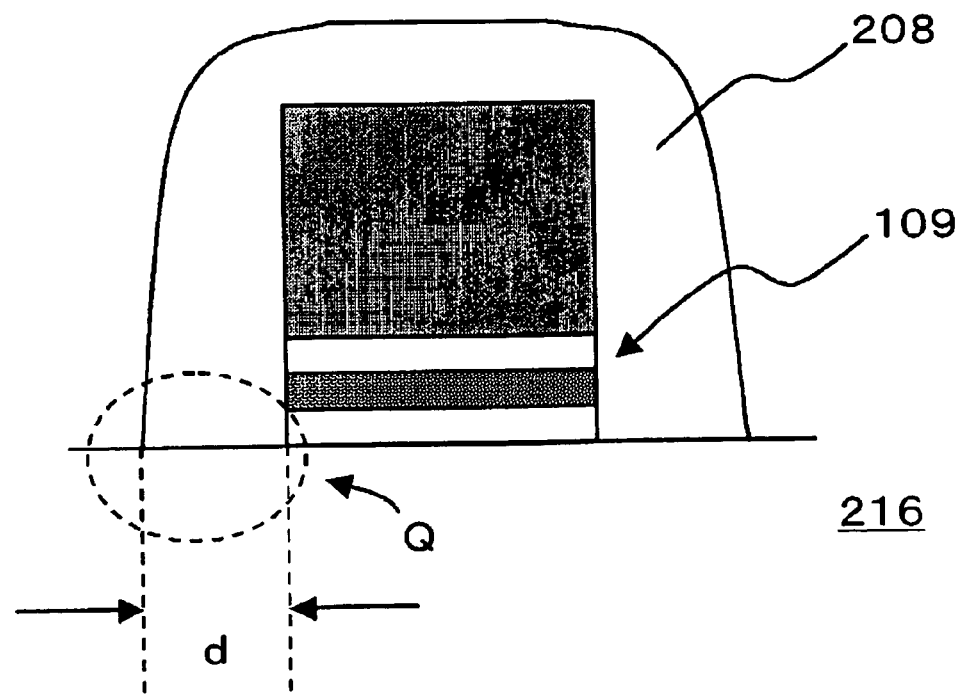

FIGS. 31A and 31B are conceptual drawings explaining the above-mentioned circumstances, and show a case where the insulating film between a memory gate and control gate is made thin in a conventional memory gate and a case where it is made thick. FIG. 31A is a drawing showing the case where the above-mentioned insulating film is made too thin. At an electrode edge, the film is likely to be too thin (indicated as P in the drawing), and an electric field is concentrated. As a result, the insulating film can easily be damaged and a short circuit between the memory gate and control gate becomes a concern. On the other hand, FIG. 31B is a drawing showing the case where the above-mentioned insulating film is made too thick. In this case, since the insulating film thickness d is too thick at a spot indicated as Q, it becomes difficult to realize the sharp change in the substrate surface potential described above, and it results in losing the high speed operability of the element.

Further, since it is possible to control the potentials of the memory gate and control gate independently in the memory element that relates to the present embodiment, securing the insulation between the gates is especially an important issue. The structure in which the gate potentials are controlled independently has an advantage that a proper voltage can be applied to each gate during write or erase operation and the operation of the memory gate can be controlled properly. However, if a current leakage between the gates occurs, the element will not function properly. Therefore, in the case where the above-mentioned structure is employed, reliably securing the insulation between the memory gate and control gate is especially an important technical issue.

Since the present embodiment employs specific cross-sectional shapes of the gates taking advantage of etch back process as described above, it is possible to stably secure the insulation between the electrodes even in the case where the thickness of the insulating film between the gates is made thin in order to realize the sharp change in the surface potential. Further, the thickness of the above-mentioned insulating film can be, for instance, not thinner than 10 nm and not thicker than 200 nm, preferably not thicker than 150 nm. With this structure, the high speed operability of the element and the stable insulation between the electrodes can both be achieved.

Figure 13:
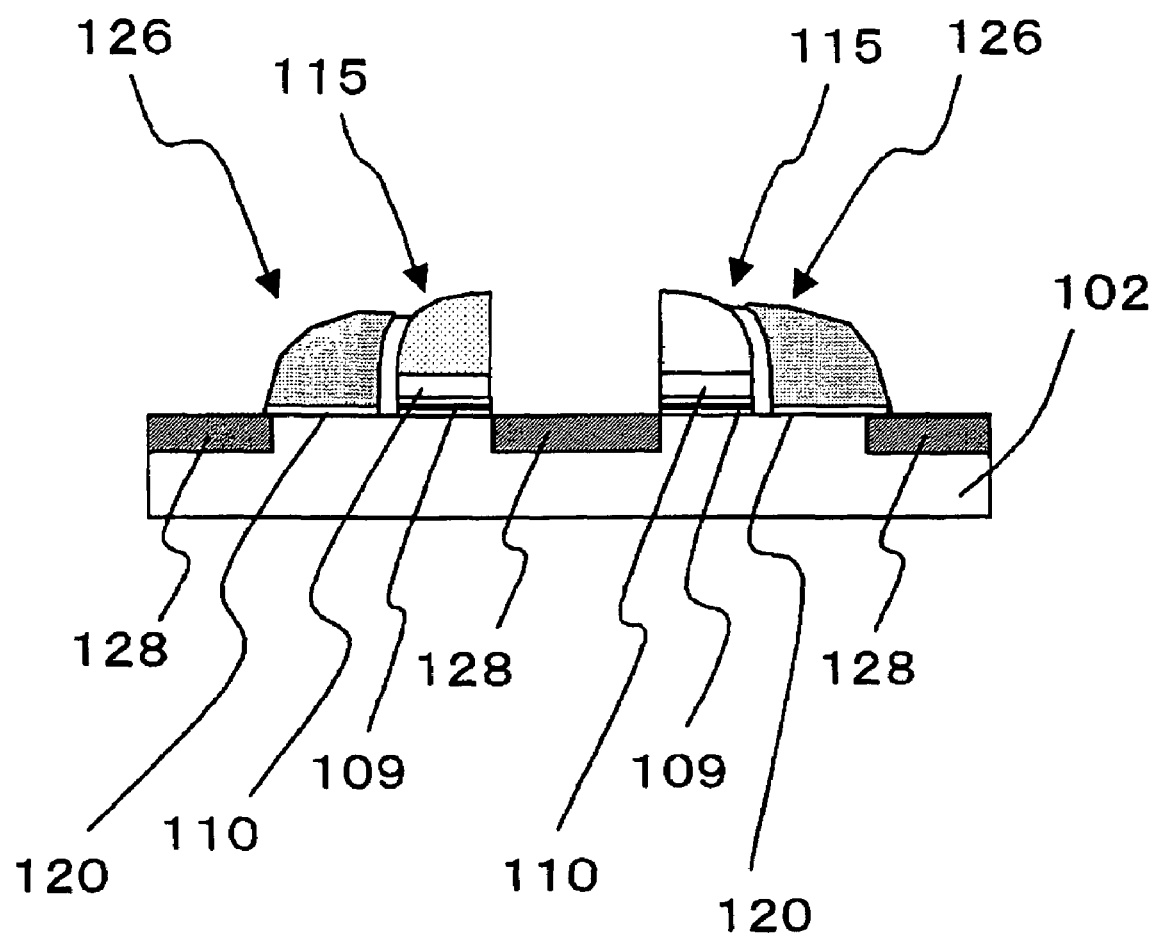
FIG. 13 is a sectional view of a non-volatile memory element of an embodiment.
Figure 14:
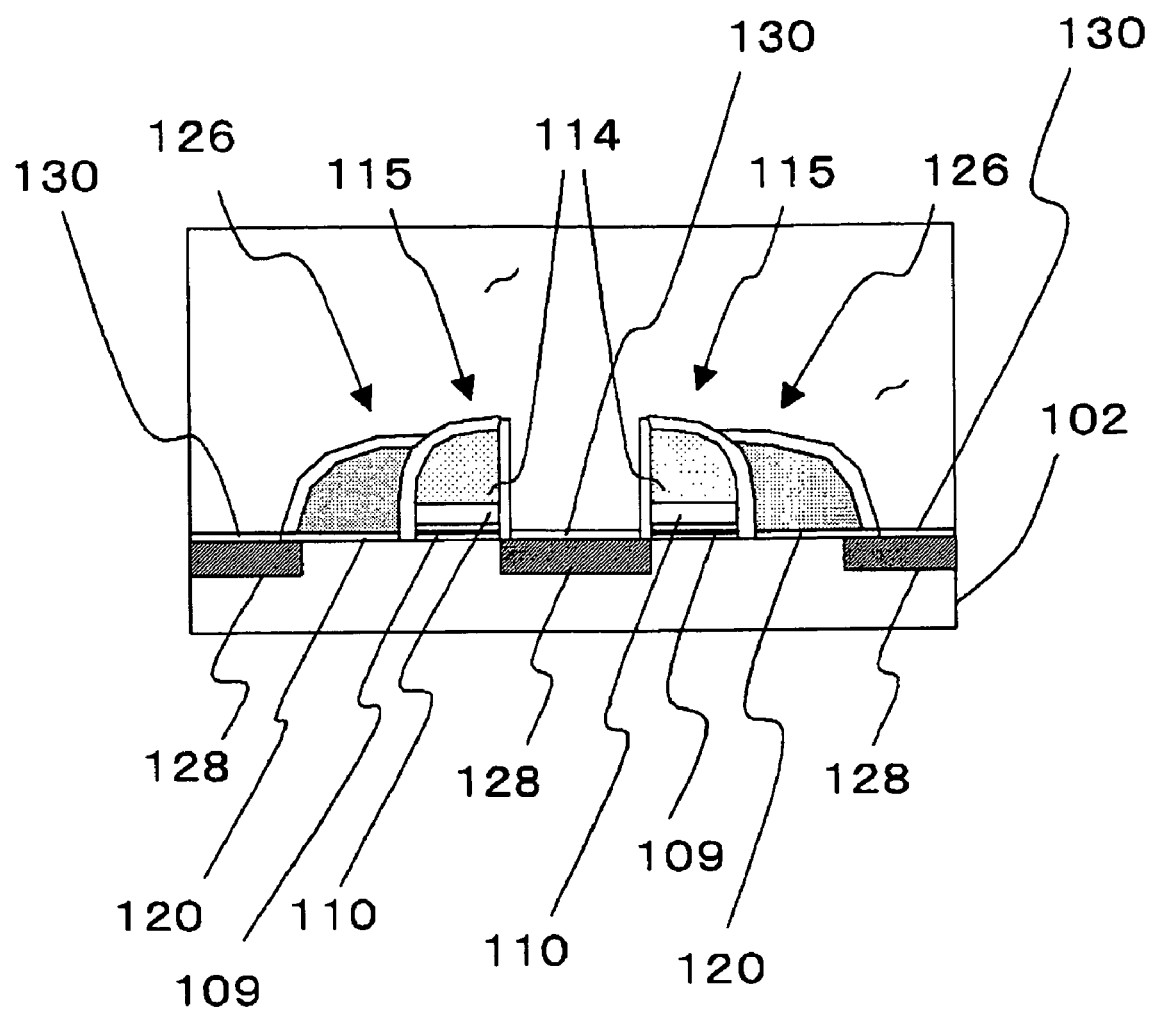
FIG. 14 is a sectional view of a non-volatile memory element of an embodiment.

One example of the memory element that relates to the present invention is described above, however, various variations are possible. FIGS. 13 and 14 show such variations.

An element shown in FIG. 13 is structured such that the floating gate 109 is removed except for the areas where the memory gates 115 are provided, and the impurity diffusion regions 128 are exposed. Further, the gate insulating film 120 is removed except for the areas where the control gates 126 are provided. The impurity diffusion regions 128 are exposed by removing the gate insulating film 120 except for this disposed beneath the memory gates 115 and control gates 126.

An element shown in FIG. 14 is structured such that a silicon oxide film 130 is provided as compared to the structure shown in FIG. 12 except for the area where the memory gate 115 is provided. After forming the structure shown in FIG. 13, the silicon oxide film 130 is formed by thermal oxidation and the element shown in FIG. 14 can be achieved.

[Embodiment 2]

Figure 23:
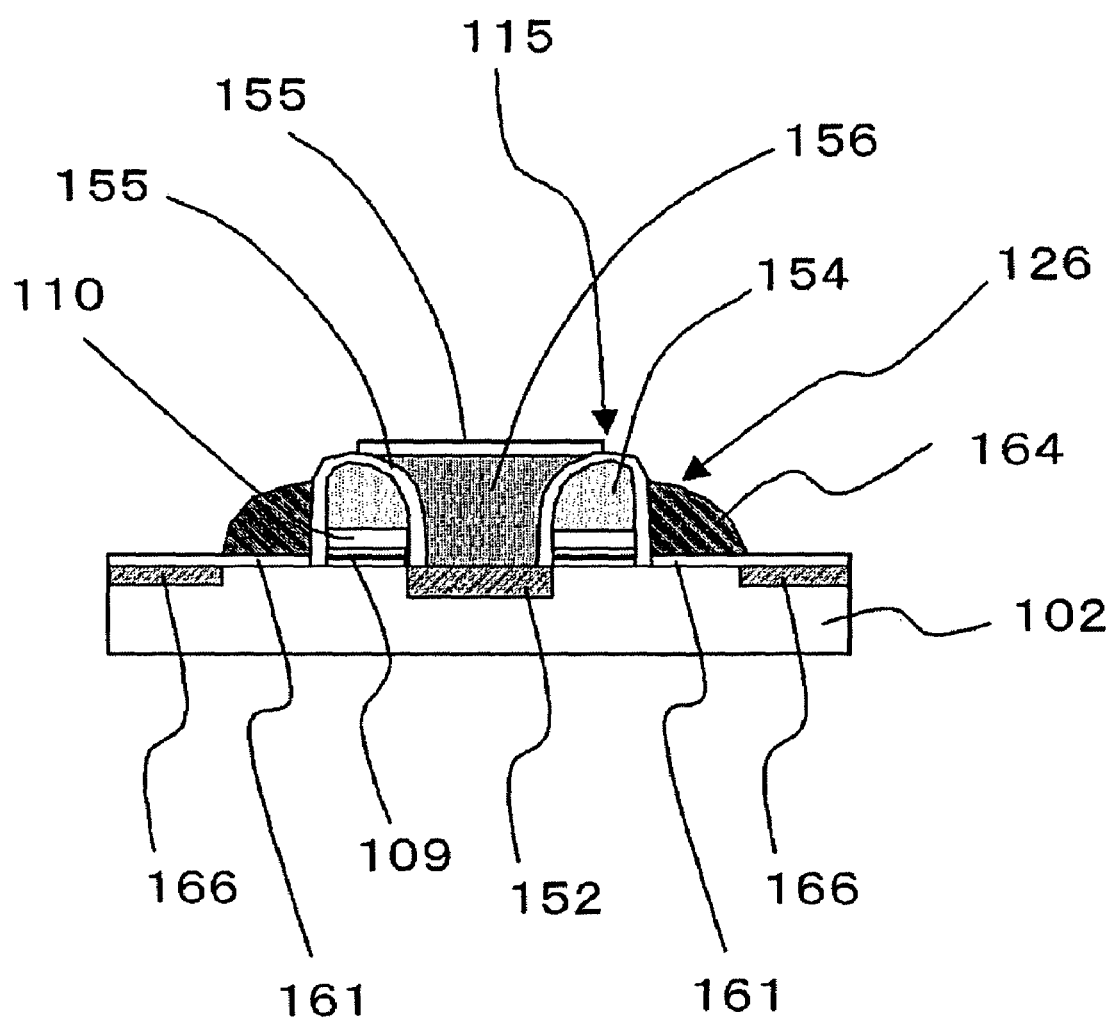
FIG. 23 is a sectional view of a non-volatile memory element of an embodiment.

FIG. 23 is a sectional view of a memory element that relates to a second embodiment. Impurity diffusion regions 152 and 166 are formed being separated from each other on the surface of a silicon substrate 102. In the regions in between the impurity diffusion regions, a memory gate 115 and a control gate 126, provided adjacently to the former, are formed.

The memory gate 115 is structured such that a floating gate 109, a (first) polycrystalline silicon film 110, and a (second) polycrystalline silicon film 154 are laminated in order. The first polycrystalline silicon film 110 and the second polycrystalline silicon film 154 are both made up of polycrystalline silicon with n-type impurities, however, the second polycrystalline silicon film can have a higher impurity concentration than the first polycrystalline silicon film 110 does. The upper part of the side of the memory gate 115 in contact with the control gate 126 has a circular or arc-shaped curve and is convex towards the control gate 126. As shown in the drawing, the cross sectional view of the memory gate 115 along the gate's longitudinal direction is nearly fan-shaped, becoming narrower towards the top and away from the silicon substrate 102.

The control gate 126 is structured such that a silicon oxide film 161 and a polycrystalline silicon film 164 are laminated in order. An HTO film 155 is interposed between the memory gate 115 and control gate 126, and insulates between the two.

The side of the control gate 126 opposite to the one in contact with the memory gate 115 is formed by etching back the deposited polycrystalline silicon film 164. This side has a circular or arc-shaped curve and is convex towards the outside and away from the control gate 126. As shown in the drawing, the cross sectional view of the control gate 126 along the gate's longitudinal direction is nearly fan-shaped, becoming narrower towards the top and away from the silicon substrate 102 between the pair of 154, a polysilicon film 156 is disposed interposed by HTO film 155 on the impurity diffusion region 152. A top HTO film 155 is disposed on the top of the polysilicon film 156 bridging the paired tops of the memory gates 154.

Figure 16A:
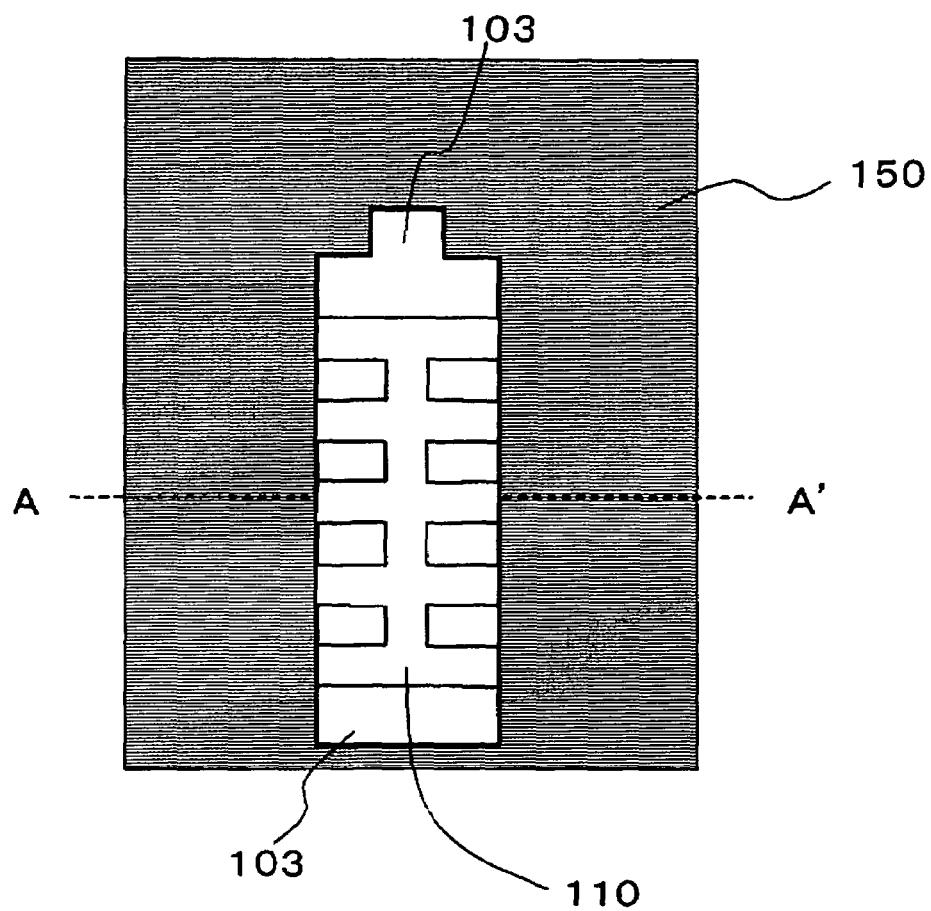
FIGS. 16A and 16B are drawings explaining a process for manufacturing a non-volatile memory element of an embodiment.
Figure 16B:
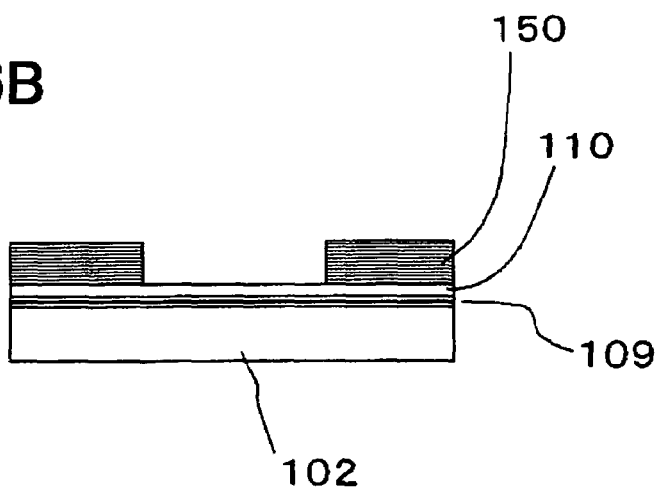

Hereinafter, a process for manufacturing the memory element shown in FIG. 23 is described with reference to drawings. First, a structure shown in FIG. 16 is formed. In other words, the floating gate 109 comprising a silicon oxide film 104, a silicon nitride film 106, and a silicon oxide film 108, and the first polycrystalline silicon film 110 are formed in this order on the silicon substrate 102. Then, after forming an element isolation region 103 and a silicon nitride film 150, an opening is created on the silicon nitride film 150 by dry etching a prescribed area, and the structure shown in FIG. 16 is achieved.

Figure 17A:
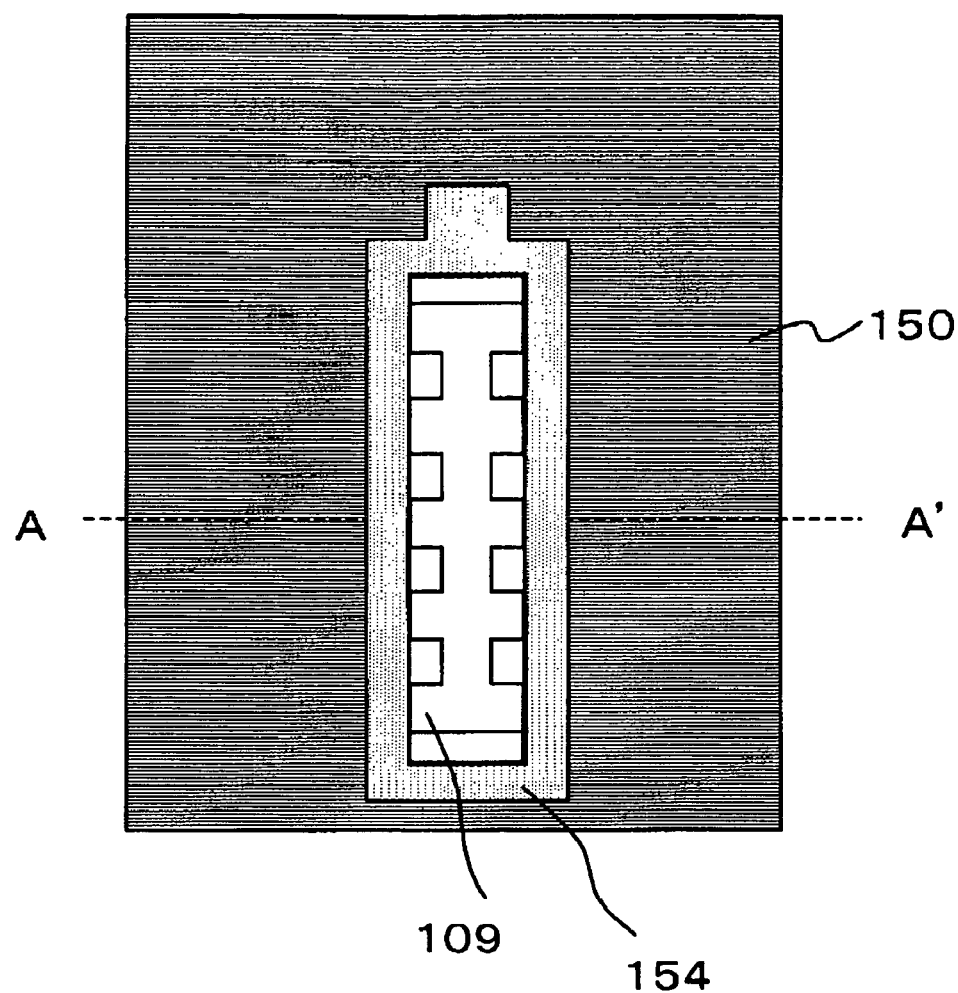
FIGS. 17A and 17B are drawings explaining a process for manufacturing a non-volatile memory element of an embodiment.
Figure 17B:
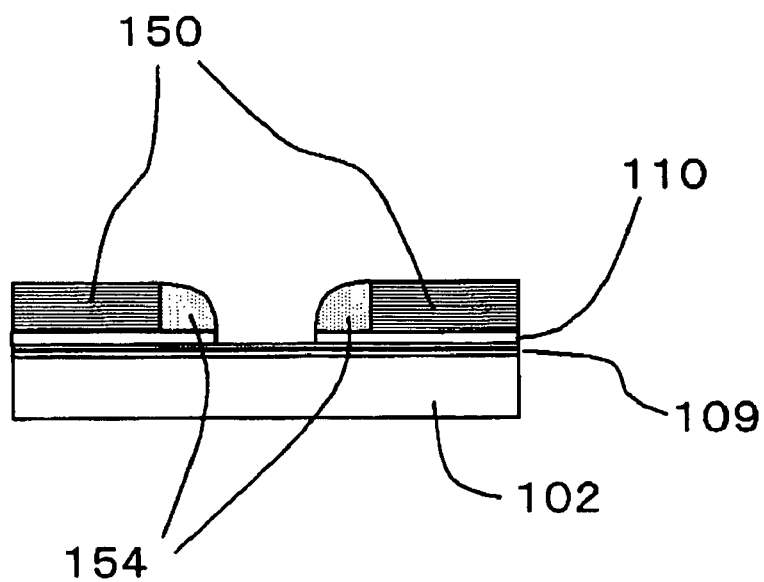

Then, after a (second) polycrystalline silicon film is formed over the whole surface of the substrate, the sidewall-shaped polycrystalline silicon 154 is formed on the lateral side of the silicon nitride film 150 by etching back (FIG. 17).

The film thickness of the second polycrystalline silicon prescribes the channel length of the memory gate, which is formed later. In the present embodiment, the film thickness of the second polycrystalline silicon is set at 150 nm. The film thickness of the second polycrystalline silicon can be as thin as approximately 30 nm, for example. By making the film thickness so thin, it becomes possible to make the channel length of the memory gate short and reduce the channel resistance of the memory gate section drastically. Therefore, the readout current can be increased and, as a result, it becomes possible to improve the operation speed.

Figure 18:
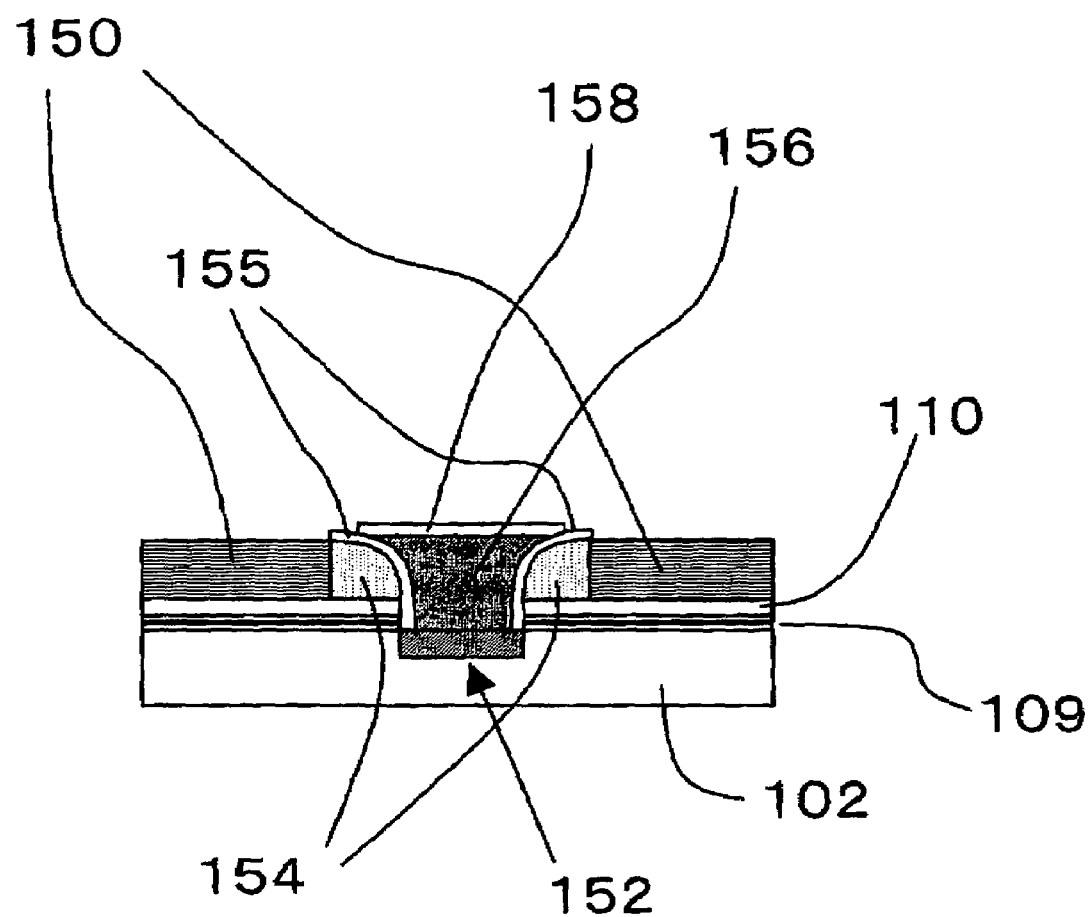
FIG. 18 is a drawing explaining a process for manufacturing a non-volatile memory element of an embodiment.

Then, by performing the plug formation processes described below, a state shown in FIG. 18 is achieved.

(i) A Step of Forming a Source Drain Region 152 by Ion Implanting.

Ion is implanted into the silicon substrate 102 through the floating gate 109. Here, As and P are implanted.

(ii) A Step of Etching Back the Floating Gate 109.

A region of the floating gate 109 surrounded by the polycrystalline silicon 154 is removed by dry etching.

(iii) A Step of Forming an HTO Film Over the Whole Surface.

The film thickness can be from 10 to 50 nm, for example. After the film is formed, a thermal oxidation process can be performed where appropriate.

(iv) A Step of Etching Back the HTO Film and Removing a Natural Oxidation Film.

An unnecessary part of the HTO film is removed by etching back so that the HTO film 155 that covers the lateral side (extending from the bottom up to the top) of the polycrystalline silicon 154 remains.

(v) A Step of Forming a (Third) Polycrystalline Silicon Film.

A (third) polycrystalline silicon film 156 is formed over the whole surface of the substrate.

(vi) A Step of Etching Back After Polishing the (Third) Polycrystalline Silicon by CMP.

By CMP and etching back, unnecessary (third) polycrystalline silicon film is removed and (third) polycrystalline silicon 156 that fills in the region between the two (second) polycrystalline silicon films 154 is formed.

(vii) A Step of Forming a Thermal Oxidation Film 158 Over the (Third) Polycrystalline Silicon Film 156.

Using the silicon nitride film 150 as a mask, the top surface of the (third) polycrystalline silicon 156 is oxidized, forming the thermal oxidation film 158, whose thickness is, e.g., approximately 50 nm.

By doing this, the top surface of the (third) polycrystalline silicon film 156 is insulated.

By the processes described above, a polycrystalline silicon film plug is formed between the pair of the polycrystalline silicon films 154.

Figure 19:
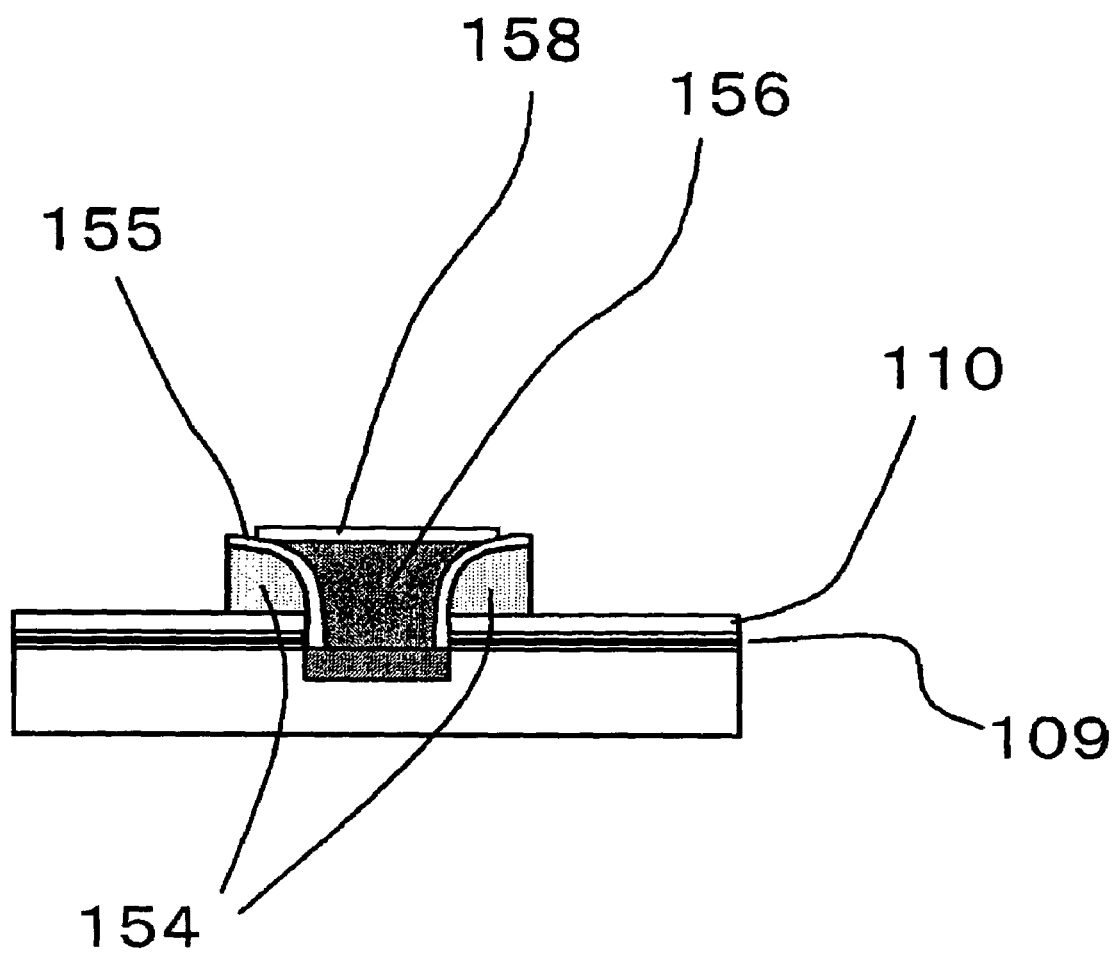
FIG. 19 is a drawing explaining a process for manufacturing a non-volatile memory element of an embodiment.

Then, the silicon nitride film 150 is selectively removed by wet etching (FIG. 19). Heated phosphoric acid can be used as the etching liquid. Since this etching liquid has a high etching selectivity between the nitride silicon film and the polycrystalline silicon, a shape shown in FIG. 19 can be formed as desired.

Then, after the polycrystalline silicon 110 and the floating gate 109 are removed by etching in order, an HTO film is formed over the whole surface of the substrate. The film thickness can be set at approximately 10 nm for example. The upper edges of the polycrystalline silicon 154 are rounded off at this time, and its shape becomes round.

Figure 20:
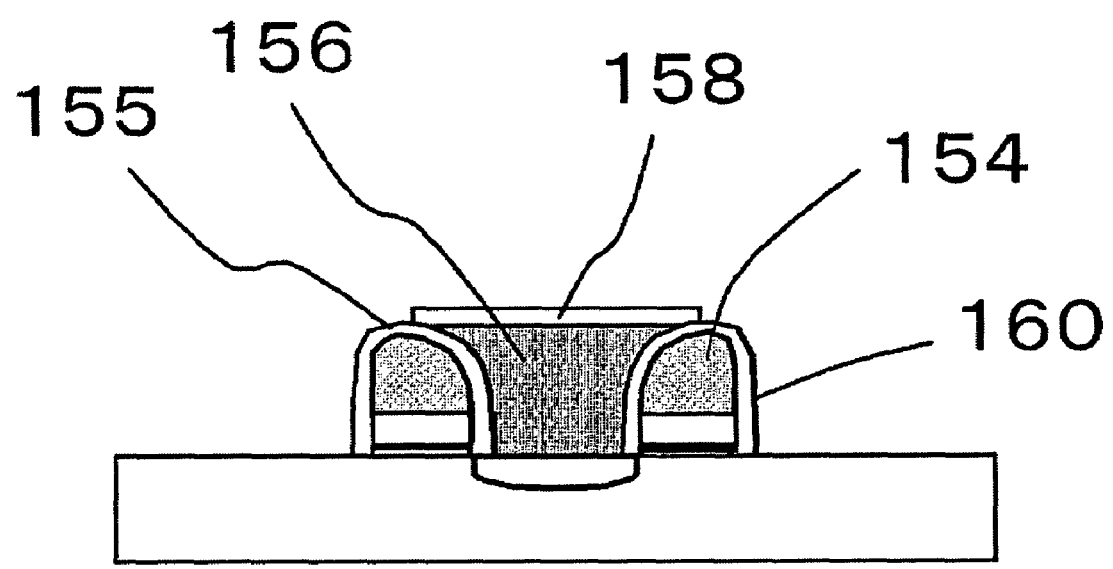
FIG. 20 is a drawing explaining a process for manufacturing a non-volatile memory element of an embodiment.

Then, the HTO film is etched back, and an HTO film 160 is left on the side of the polycrystalline silicon film 154 as shown in FIG. 20. The HTO film 160 will insulates the memory gate from the control gate.

Figure 21A:
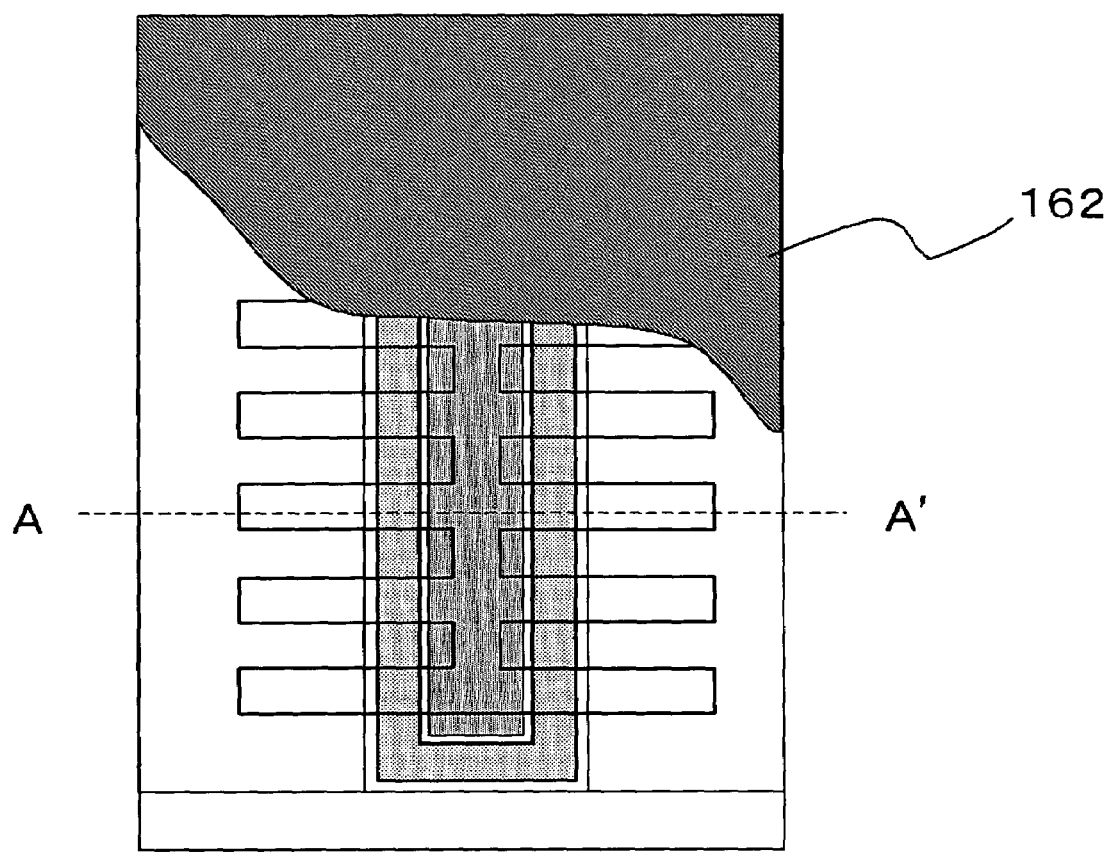
FIGS. 21A and 21B are drawings explaining a process for manufacturing a non-volatile memory element of an embodiment.
Figure 21B:
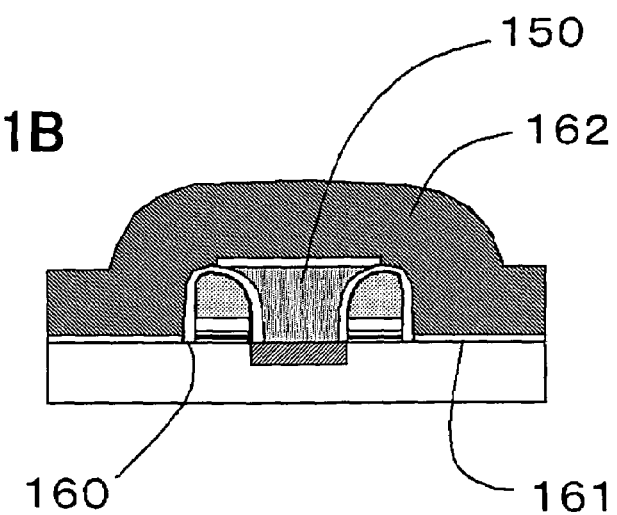

After this step, a fourth polycrystalline silicon film 162 is formed as shown in FIG. 21. By etching back the fourth polycrystalline silicon film 162, a structure in which the memory gate 115 comprising the floating gate 109, the first polycrystalline silicon film 110 and the second polycrystalline silicon film 154 laminated in order, and the control gate 126 comprising the silicon oxide film 161 and the fourth polycrystalline silicon film 164 laminated in order, are provided adjacent to each other is achieved. The height of the control gate 126 is formed shorter than that of the memory gate 115.

Figure 22A:
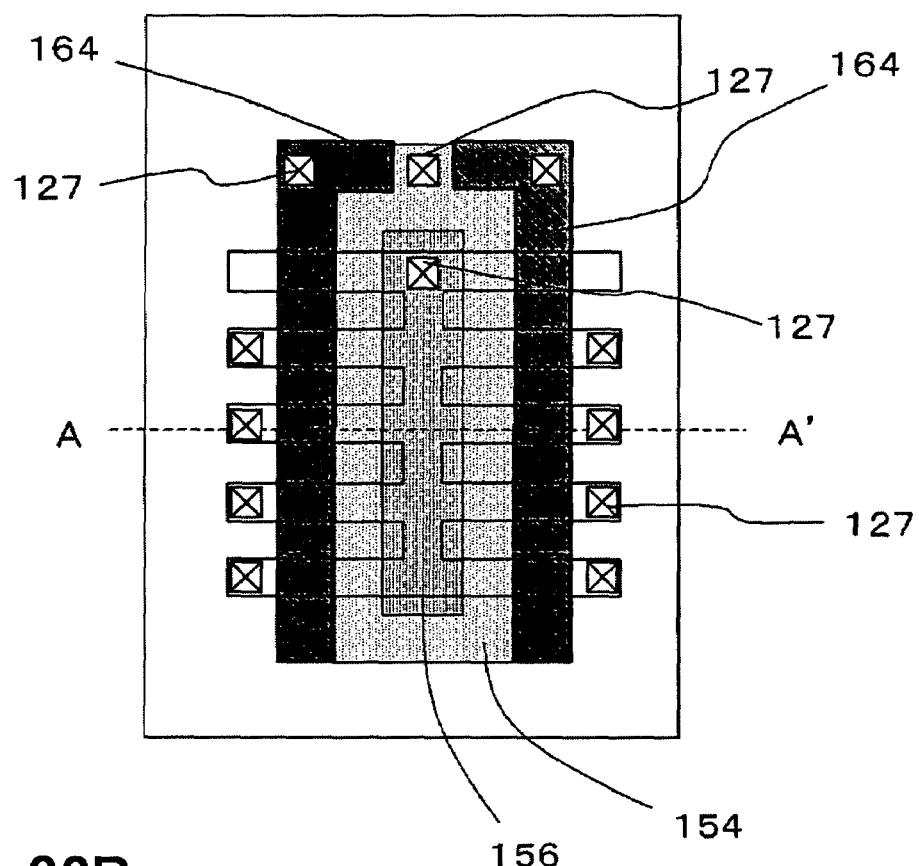
FIGS. 22A and 22B are drawings explaining a process for manufacturing a non-volatile memory element of an embodiment.
Figure 22B:
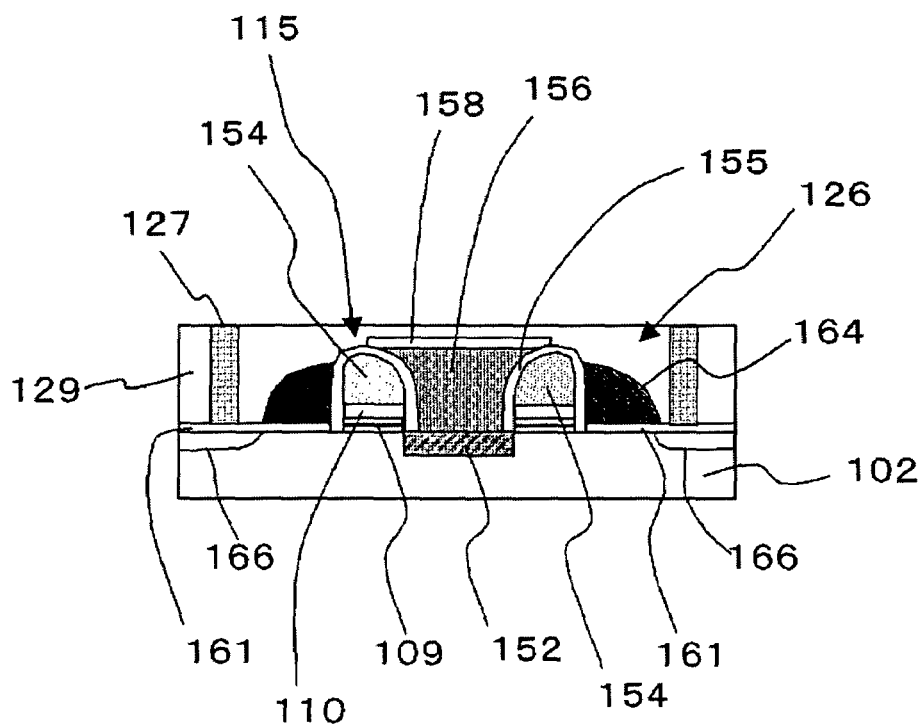

Then, ion is implanted and the impurity diffusion regions 166 are formed on the both sides of the memory gate and control gate. Then, the interlayer-insulating film 129 is formed. Contact plugs 127 are formed on the top of the impurity diffusion region 152, impurity diffusion region 166, memory gate 115, and control gate 126, and a memory element shown in FIG. 22 is achieved. FIG. 22B is a sectional view perpendicular to the extended direction of the polycrystalline silicon 156, and as shown in the drawing, one side of the (second) polycrystalline silicon film 154 is in contact with the (third) polycrystalline silicon film 156 interposed with HTO 155, however, the upper part of the opposite side has a smoothly curved surface.

The operation effects of the memory element shown in FIG. 23 are as follows:

In the memory element that relates to the present embodiment, since the third polycrystalline silicon film 156 is formed on the top of the impurity diffusion region 152, diffusion layer resistance that increases as the element is scaled down can be reduced.

Furthermore, due to the shapes and positions of the memory gate and control gate, the same effects as that of the first embodiment can be obtained.

Since the control gate 126 is formed self-alignedly by etching back, the problem such as the misalignment described in the conventional technology paragraphs does not occur, and a desired structure can be achieved controllably. Also, the channel length of the control gate 126 can be remarkably short. In the conventional technology, separate lithography steps are performed at the stages of forming the memory gate 115 and control gate 126. Therefore, when the channel length is made shorter, a misalignment can easily occur and it is very difficult to control the positional relationship between the control gate 126 and memory gate 115. In the present embodiment, since the control gate 126 is formed by etching back, such a problem can be solved and it becomes possible to produce a fine element controllably. For example, even in the case where the channel length of the control gate 126 is set at not more than 100 nm or even 50 nm or less, the control gate 126 can be formed with good position controllability.

Further, since the height of the control gate 126 is shorter than that of the memory gate 115, the insulation between the control gate 126 and memory gate 115 is secured well. Since the insulating film is formed stably on the side of the memory gate 115, by making the height of the control gate 126 shorter, the insulation between the two will be stable. Also, the short circuit between the control gate 126 and polycrystalline silicon 156 can be prevented.

Further, the upper part of the side of the memory gate 115 that is in contact with the control gate 126 has a curved surface. Since it is not angular edge, thin film portion is not likely to occur in the insulating film, and the insulation between the memory gate 115 and control gate 126 becomes stable from this standpoint as well.

Furthermore, since the side of the control gate 126 is structured such that it has a curved surface as the memory gate 115, the embedding property of the memory gate 115 and control gate 126 by the insulating film becomes superior, and the flatness of their upper layers will be high.

Also, in the present embodiment, the high speed operability of the memory element can be maintained while the insulation between the memory gate and control gate is ensured. With the memory element that relates to the present embodiment, since it is possible to control the potentials of the memory gate and control gate independently, securing the insulation between the gates becomes especially an important issue. The structure in which the gate potentials are controlled independently has an advantage that a proper voltage can be applied to each gate during write or erase operation and the operation of the memory gate can be controlled properly. However, if a current leakage between the gates occurs, the element will not function properly. Therefore, in the case where the above-mentioned structure is employed, reliably securing the insulation between the memory gate and control gate is especially an important technical issue.

Since the present embodiment employs specific cross-sectional shapes of the gates as described above, it is possible to stably secure the insulation between the electrodes even in the case where the thickness of the insulating film between the gates is made thin in order to realize a sharp change in the surface potential. Further, the thickness of the above-mentioned insulating film can be not thinner than 10 nm and not thicker than 200 nm, preferably not thicker than 150 nm. With this structure, the high speed operability of the element and the stable insulation between the electrodes can both be achieved.

[Embodiment 3]

Figure 24A:
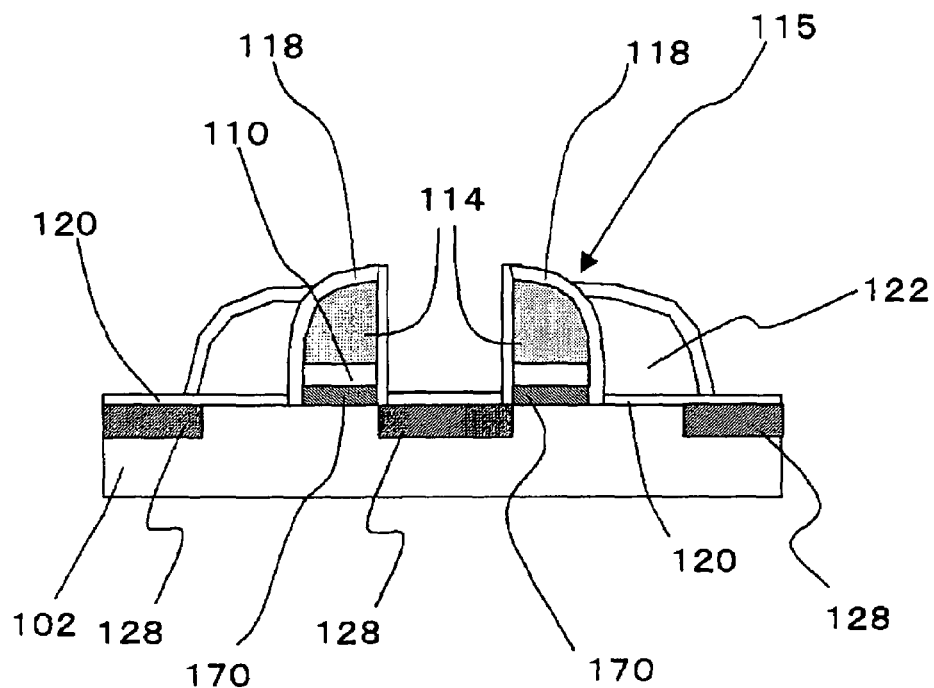
FIGS. 24A and 24B are sectional views of a non-volatile memory element of an embodiment.

In the embodiments described above, a charge accumulation section made up of a so-called ONO film in which a silicon oxide film, silicon nitride film, and silicon oxide film are laminated in order is provided, however, a charge accumulation section made up of other materials can be provided as well. FIG. 24A shows an example of such a structure.

In FIG. 24A, instead of an ONO film, a floating gate 170 in which silicon oxide film, polycrystalline silicon film, and silicon oxide film are laminated in order is used.

Figure 24B:
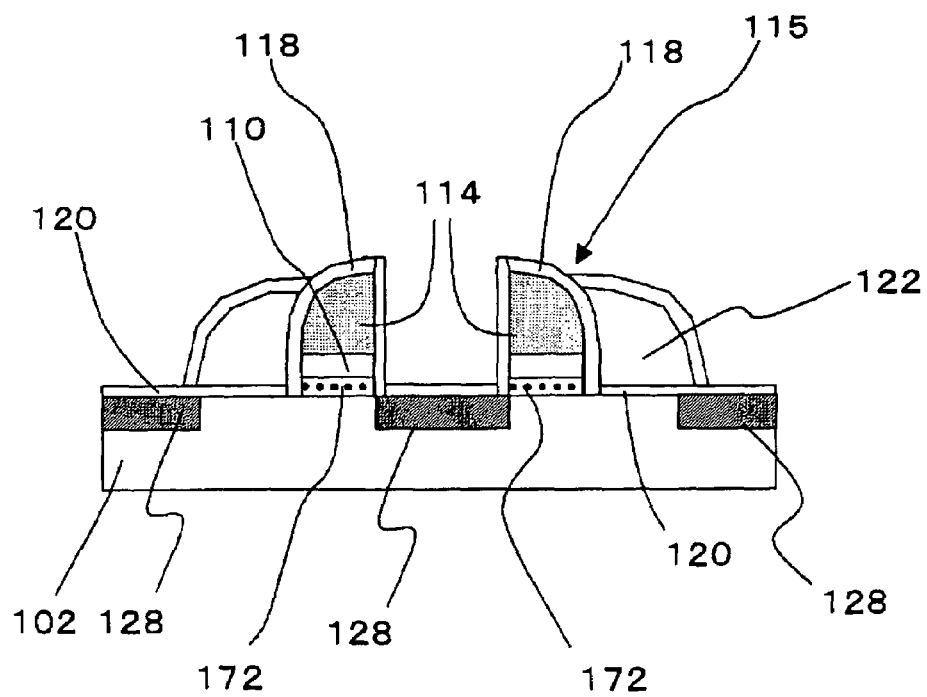

In FIG. 24B, a floating gate 172 in which silicon oxide film, silicon dot layer, and silicon oxide film are laminated in order is used. The silicon dot layer means a state where granular silicon dots with a diameter of, e.g., approximately 10 nm (spherical, half-spherical, columnar or island-shaped) are dispersed with an interval of e.g., approximately 5 nm. This structure has an advantage that the time degradation of the memory gate can be suppressed. With memory gates, a part of the insulating film, which is a part of the charge accumulation section, gets damaged by long-term use. At the damaged area, leakage occurs between the substrate and the charge accumulation region. As a result, the electric charges accumulated in the memory cell are discharged and the state of the memory cell might change from the data write state to the data erase state. With the structure shown in FIG. 24B in which the silicon dot layer is made to be the charge accumulation region, such unwanted results of the leakage can be minimized. Similar effects can be achieved even if the silicon dot described above is replaced by silicon nitride dot or germanium dot.

Figure 15A:
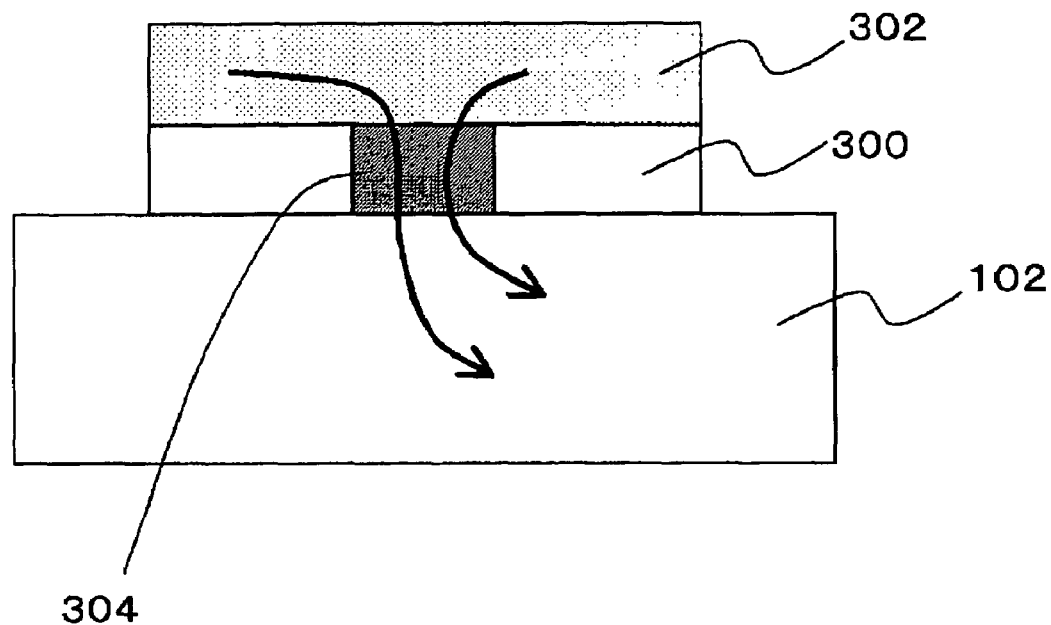
FIGS. 15A and 15B are conceptual drawings explaining the mechanism with improved reliability of a non-volatile memory element comprising a memory gate with a fine dot-like electric charge accumulation region.
Figure 15B:
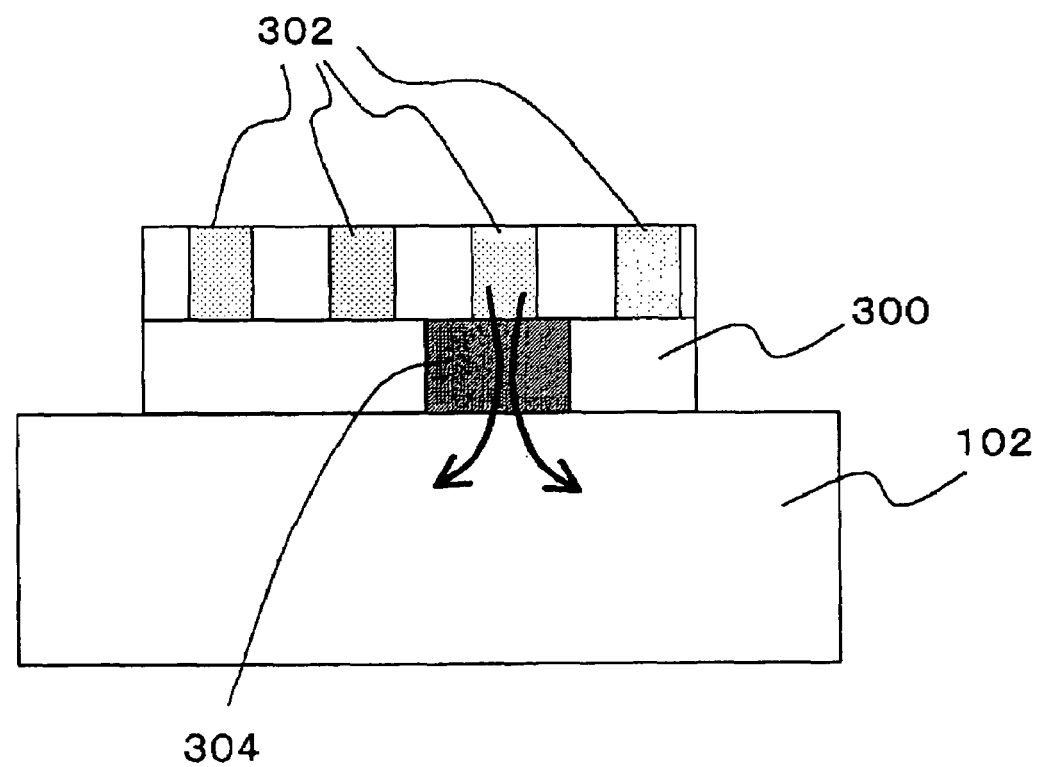

FIG. 15 is a drawing for explaining the issue described above. When polycrystalline silicon 302 is formed in layer as a continuum as shown in FIG. 15A, all the electric charges accumulated in the polycrystalline silicon 302 are discharged into the silicon substrate 102 through a damaged area 304 formed within a silicon oxide film 300. On the other hand, with a structure in which the polycrystalline silicon 302 is formed discretely like dots as shown in FIG. 15B, only the electric charges accumulated in the part of the polycrystalline silicon 302 that is in contact with the damaged area 304 are discharged, and the electric charges accumulated in other parts of the polycrystalline silicon 302 are preserved stably. The silicon dot can be formed by a CVD method and by setting CVD conditions properly, a desired dot shape can be achieved.

[Embodiment 4]

In the embodiments described above, the structure in which a voltage can be applied to the memory gate 115 and it is possible to erase data by extracting the electric charges accumulated in the floating gate 109 into the silicon substrate 102 or polycrystalline 114 is utilized, however, a structure in which the memory gate electrode is put into a floating state without having a contact hole, and the accumulated electric charges cannot be extracted is also possible. In this case, the memory element becomes a ROM (Read Only Memory).

Figure 25A:
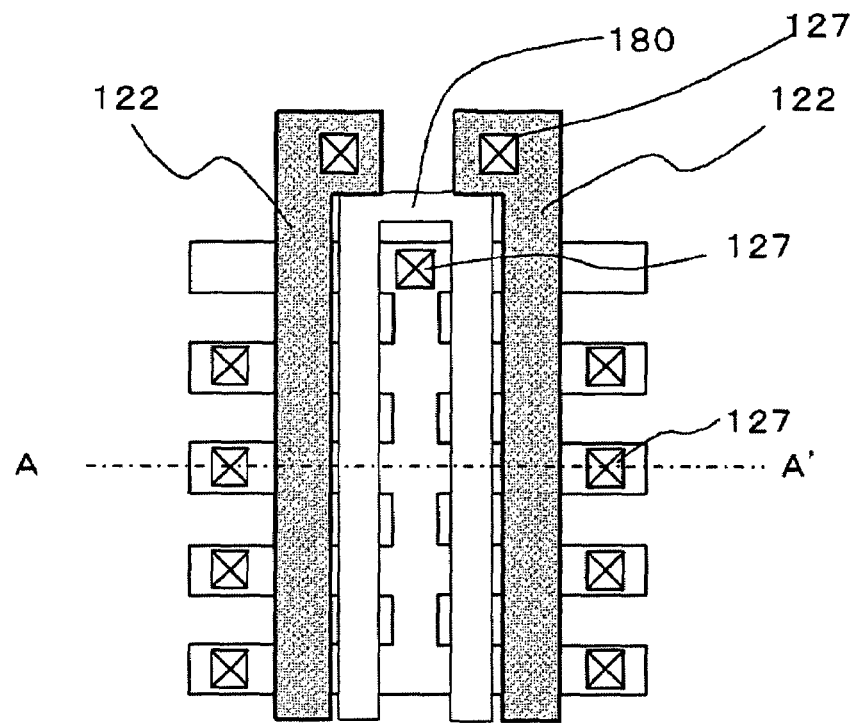
FIGS. 25A and 25B are drawings showing an example in which the present invention is applied to a ROM (Read Only Memory).
Figure 25B:
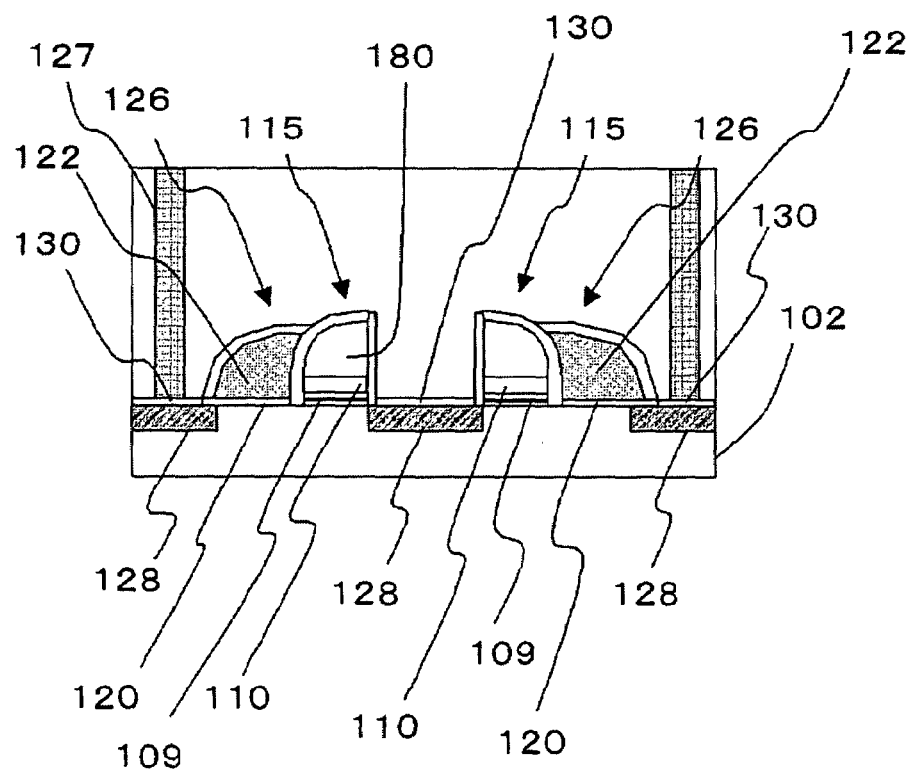

FIG. 25 shows an example of such an element. FIG. 25A is a plan and FIG. 25B is a cross sectional view taken along a line A–A' in FIG. 25A. In the element shown in the drawing, the polycrystalline silicon 114 of the element shown in FIG. 14 is replaced by an HTO film 180, however, this replacement is not necessary and the polycrystalline silicon 114 does not have to be replaced. What is important is to have the structure in which the memory gate electrode is put into a floating state without having a contact hole. This element has the structure in which the HTO film 180 is electrically floating and erase operation is not possible while write operation is, unlike the other embodiments described above. With this non-volatile memory element, it is also possible to inject hot electrons (perform a data write operation) into the charge accumulation region (the SiNx layer and polycrystalline silicon layer) by controlling the voltage of a control gate 122 and a source drain. Further, the element that relates to the present embodiment can be produced by the same process as in Embodiment 1.

Figure 26A:
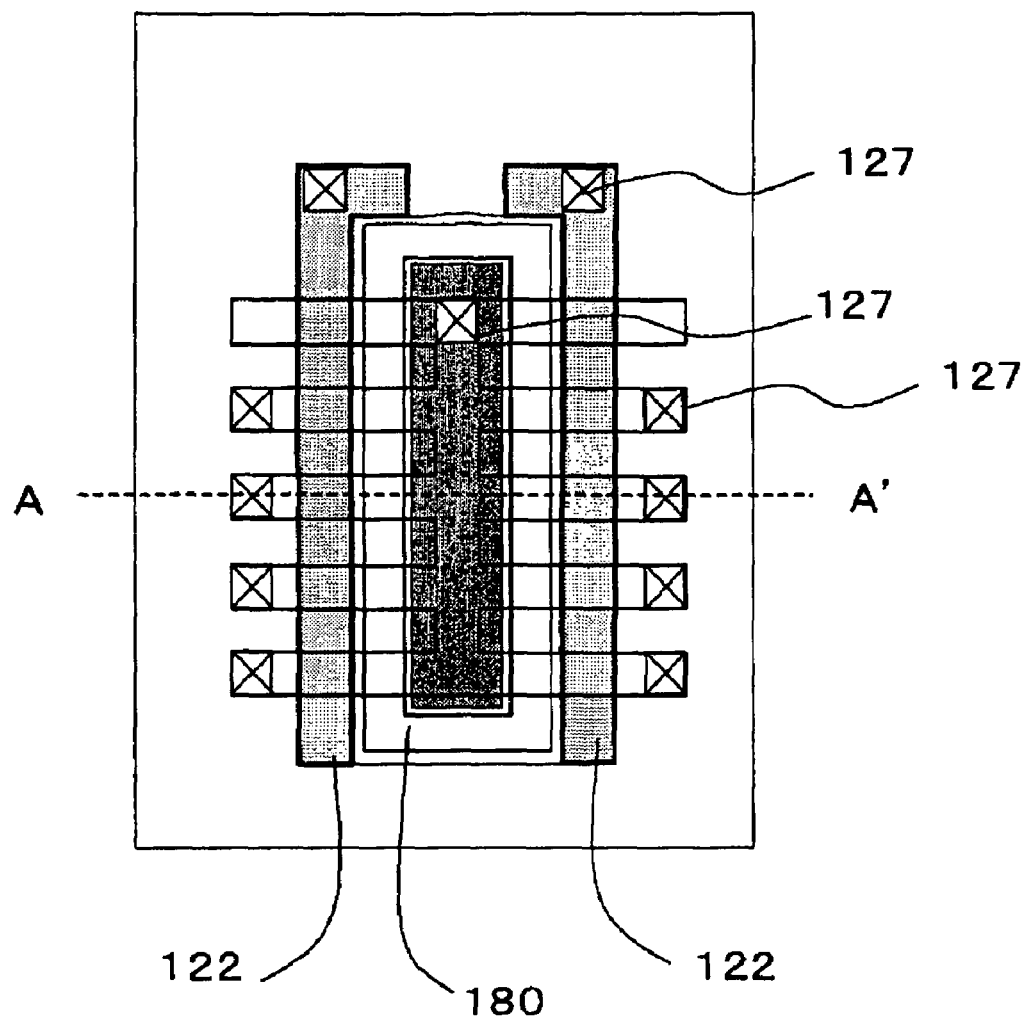
FIGS. 26A and 26B are drawings showing an example in which the present invention is applied to a ROM (Read Only Memory).
Figure 26B:
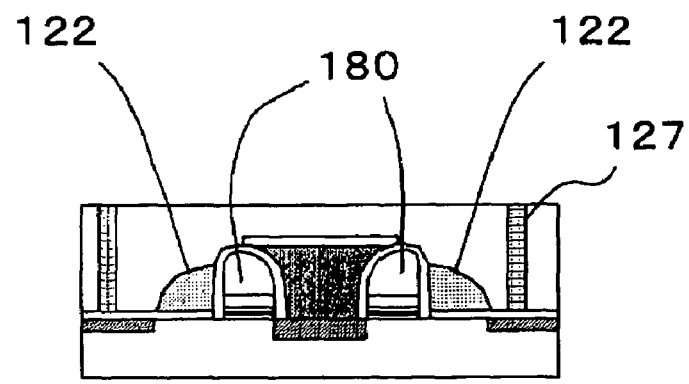
Figure 27A:
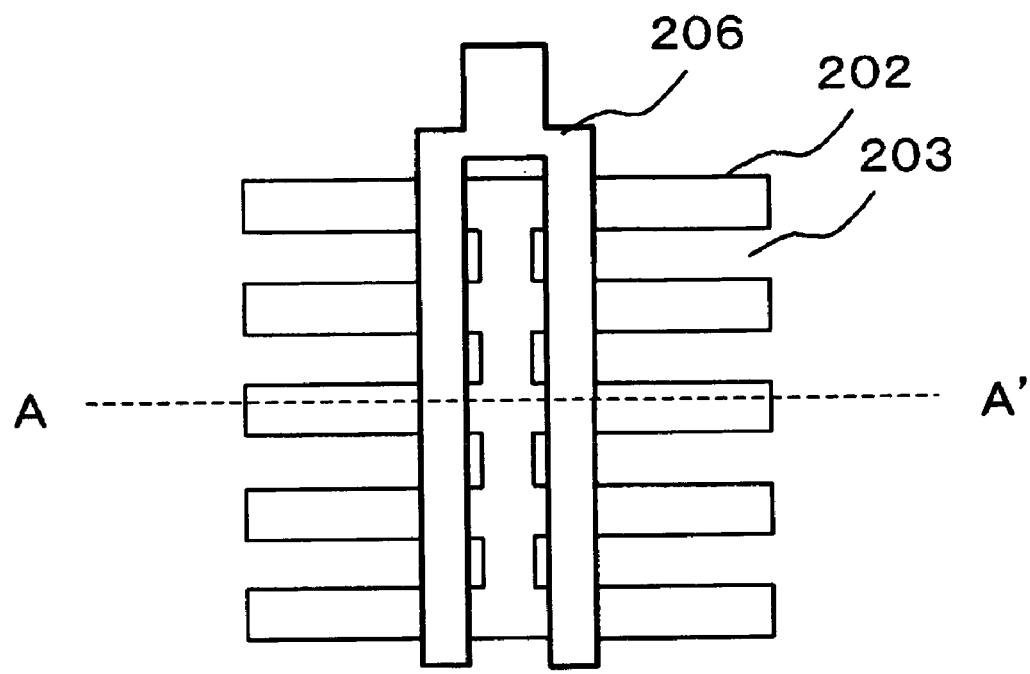
FIGS. 27A and 27B are drawings explaining problems in a conventional element structure.
Figure 27B:
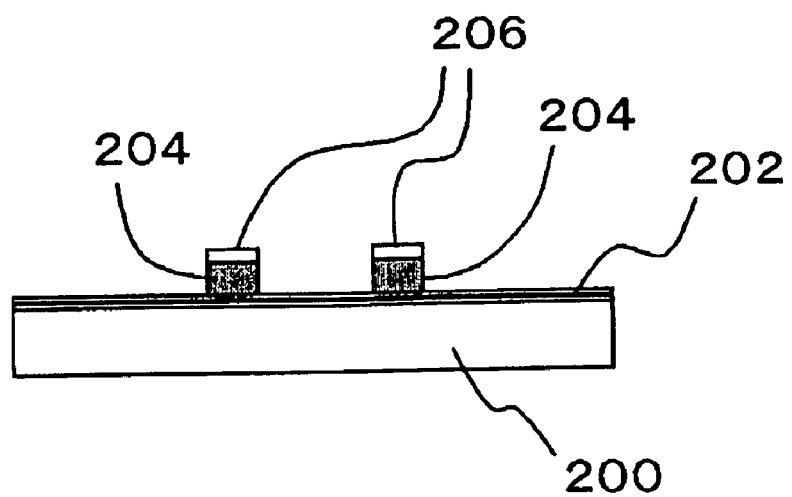
Figure 28A:
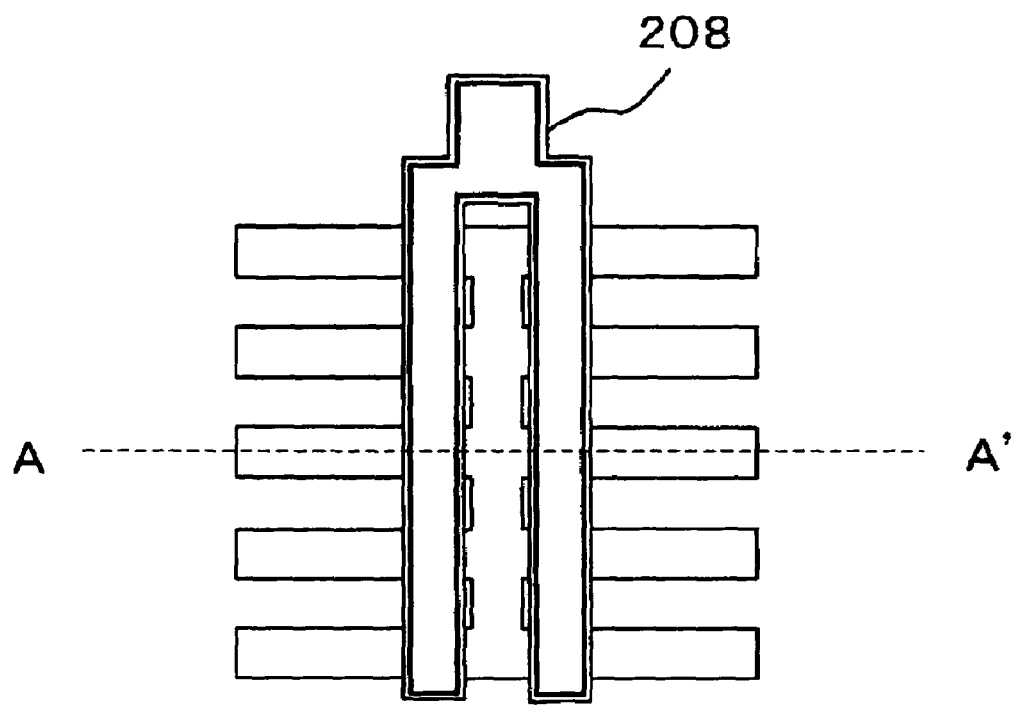
FIGS. 28A and 28B are drawings explaining problems in the conventional element structure.
Figure 28B:
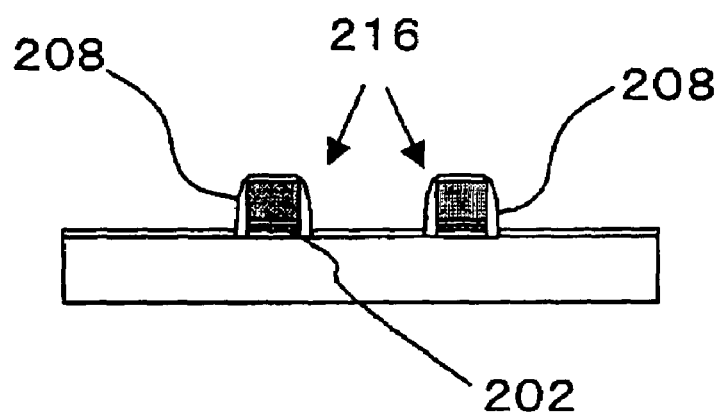
Figure 29A:
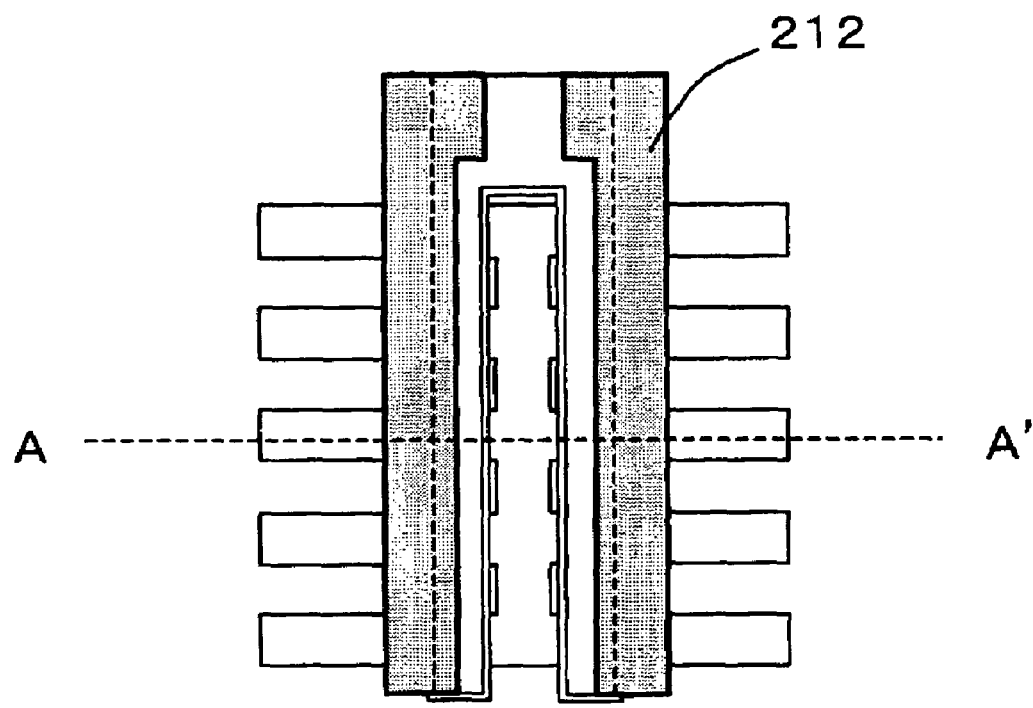
FIGS. 29A and 29B are drawings explaining a process for manufacturing a conventional non-volatile memory element.
Figure 29B:
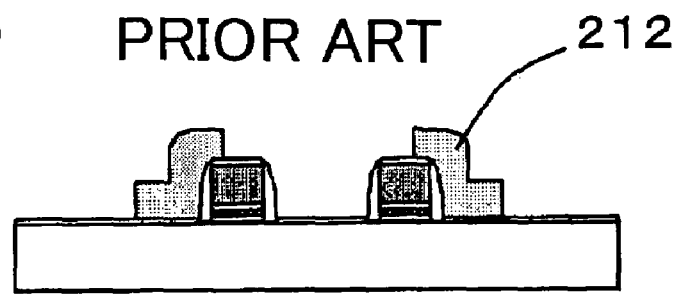
Figure 30A:
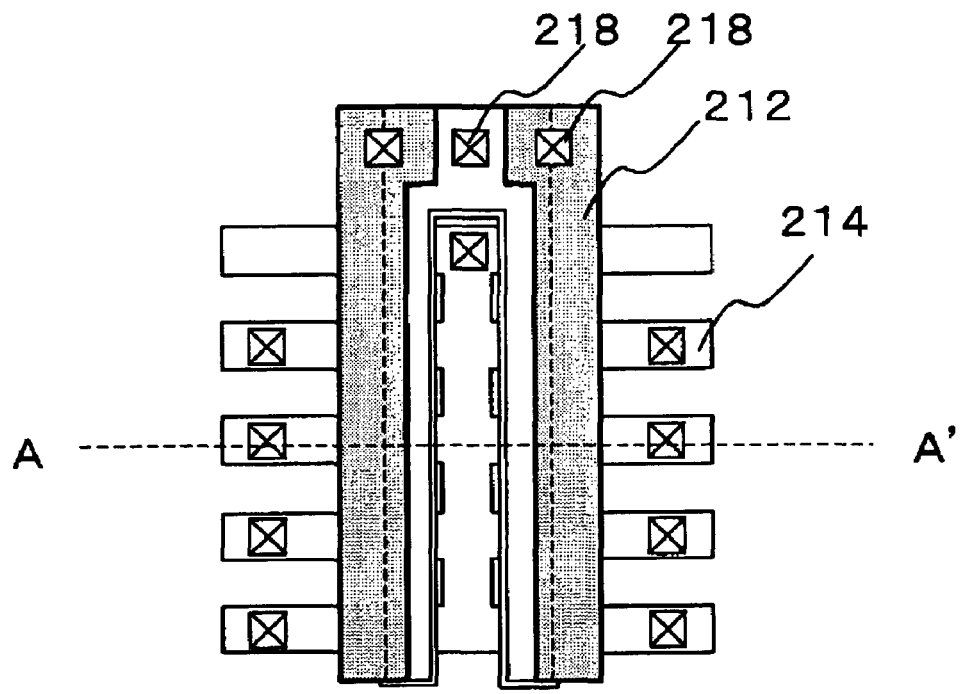
FIGS. 30A and 30B are drawings explaining a process for manufacturing a conventional non-volatile memory element.
Figure 30B:
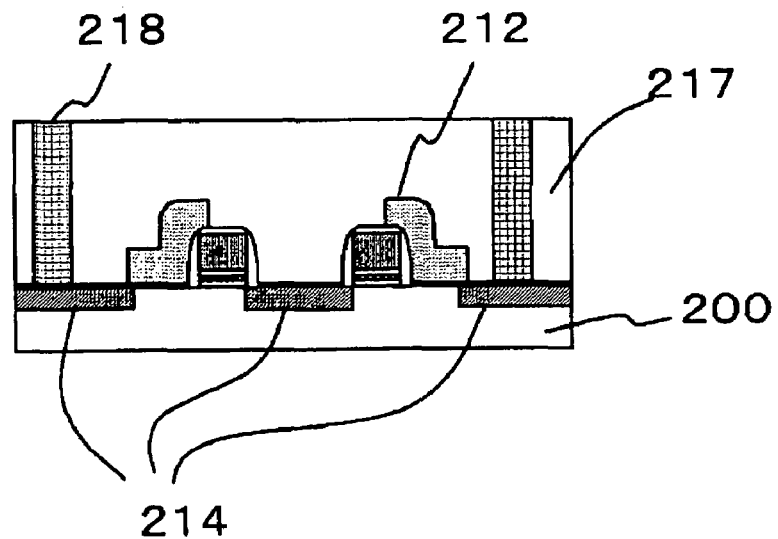

FIG. 26 shows another example of a ROM-type memory element, and the polycrystalline silicon 154 of the element shown in FIG. 23 is replaced by an HTO film 180. FIG. 26A is a plan and FIG. 26B is a sectional view taken along a line A–A' in FIG. 26A. Compared to the example shown in FIG. 25, this element has advantages that diffusion layer resistance can be reduced and the data read speed is improved.

Some preferred embodiments of the present invention are described above with reference to the drawings, however, these are merely examples of the present invention and various other structures not discussed above can be employed.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A non-volatile memory element comprising:
   a semiconductor substrate;
   a first impurity diffusion region and a second impurity diffusion region provided on said semiconductor substrate;
   a memory gate, with a charge accumulation section, provided on a part of a channel region disposed between said first and second impurity diffusion regions and;
   a control gate provided on another part of said channel region adjacent to said memory gate interposed with an insulating film, wherein;
   electric potentials of said memory gate and said control gate are controlled independently; and
   said memory gate has a curved surface on a side in contact with said control gate, said curved surface being convex towards said control gate, said control gate being provided on said curved surface interposed with said insulating film.

2. The non-volatile memory element as defined in claim 1 wherein said control gate has a cross sectional shape along that a longitudinal direction of said gate becomes narrower towards the top and away from said semiconductor substrate.

3. The non-volatile memory element as defined in claim 1 wherein a side of said control gate opposite to the one adjacent to said memory gate has a curved surface and is convex towards the outside.

4. The non-volatile memory element as defined in claim 1 wherein said control gate is formed by etching back.

5. The non-volatile memory element as defined in claim 1 wherein said memory gate is formed by etching back and said control gate is provided laterally on a side formed by etching back.

6. The non-volatile memory element as defined in claim 1 wherein the height of said control gate is shorter than that of said memory gate.

7. The non-volatile memory element as defined in claim 1 wherein said memory gate comprises a charge accumulation section, a first conductive film containing a first conductivity type impurity provided on said charge accumulation section, and a second conductive film of a first conductivity type provided on said first conductive film and;
   said first conductive film has an impurity concentration different from the impurity concentration of said second conductive film.

8. The non-volatile memory element as defined in claim 1 wherein said memory gate has an electrode width not less than 20 nm and not more than 200 nm.

9. The non-volatile memory element as defined in claim 1 wherein said charge accumulation section comprises a silicon nitride layer, and insulating layers are provided above and below said silicon nitride layer sandwiching the silicon nitride layer.

10. The non-volatile memory element as defined in claim 1 wherein said charge accumulation section comprises multiple dot-shaped dielectric materials disposed separated from one another, and insulating layers are provided above and below said dot-shaped dielectric materials sandwiching said dot-shaped dielectric materials.

11. A semiconductor device comprising: a pair of the non-volatile memory elements as defined in claim 1 provided in parallel, wherein said second impurity diffusion region shared by the non-volatile memory elements is located in a region sandwiched by these non-volatile memory elements; and
   a conductive material is embedded in an area of said second impurity diffusion region sandwiched by said pair of the non-volatile memory elements.

12. A memory element comprising:
a semiconductor substrate;
a first impurity diffusion region and a second impurity diffusion region provided on said semiconductor substrate;
a memory gate, with a charge accumulation section, provided on a part of a channel region disposed between said first and second impurity diffusion regions and;
a control gate provided on another part of said channel region adjacent to said memory gate interposed with an insulating film, wherein;
electric potentials of said memory gate and said control gate are controlled independently;
said memory gate has a curved surface on a side in contact with said control gate, said curved surface being convex towards said control gate, said control gate being provided on said curved surface interposed with said insulating film,
said control gate having a cross sectional shape along that a longitudinal direction of said gate becomes narrower towards the top and away from said semiconductor substrate.

13. The memory element as defined in claim 12 wherein a side of said control gate opposite to the one adjacent to said memory gate has a curved surface and is convex towards the outside.

14. The memory element as defined in claim 13 wherein said control gate is formed by etching back.

15. The memory element as defined in claim 14 wherein said memory gate is formed by etching back and said control gate is provided laterally on a side formed by etching back.

16. The memory element as defined in claim 15 wherein the height of said control gate is shorter than that of said memory gate.

17. The memory element as defined in claim 12 wherein said memory gate comprises a charge accumulation section, a first conductive film containing a first conductivity type impurity provided on said charge accumulation section, and a second conductive film of a first conductivity type provided on said first conductive film and;

said first conductive film has an impurity concentration different from the impurity concentration of said second conductive film.

18. The memory element as defined in claim 12 wherein said charge accumulation section comprises multiple dot-shaped dielectric materials disposed separated from one another, and insulating layers are provided above and below said dot-shaped dielectric materials sandwiching said dot-shaped dielectric materials.

* * * * *